(12) United States Patent
Wang et al.

(10) Patent No.: US 12,733,417 B2
(45) Date of Patent: Sep. 8, 2026

(54) METHOD OF MANUFACTURING SEMICONDUCTOR DEVICE

(71) Applicant: Renesas Electronics Corporation, Tokyo (JP)

(72) Inventors: Yanzhe Wang, Tokyo (JP); Sho Nakanishi, Tokyo (JP)

(73) Assignee: Renesas Electronics Corporation, Tokyo (JP)

( * ) Notice: Subject to any disclaimer, the term of this patent is extended or adjusted under 35 U.S.C. 154(b) by 373 days.

(21) Appl. No.: 18/437,869

(22) Filed: Feb. 9, 2024

(65) Prior Publication Data

US 2024/0290618 A1 Aug. 29, 2024

(30) Foreign Application Priority Data

Feb. 27, 2023 (JP) ................................ 2023-028637

(51) Int. Cl.

*H10P 32/10* (2026.01)
*H10D 8/01* (2025.01)
*H10P 32/14* (2026.01)

(52) U.S. Cl.

CPC ............. *H10P 32/171* (2026.01); *H10D 8/01* (2025.01); *H10P 32/1408* (2026.01)

(58) Field of Classification Search

CPC ...... H10P 32/171; H10P 32/1408; H10D 8/01
USPC .......................................................... 438/542
See application file for complete search history.

(56) References Cited

U.S. PATENT DOCUMENTS 5,849,613 A * 12/1998 Peidous .............. H10W 10/012 438/234
2001/0038122 A1* 11/2001 Matsuzaki ............ H10D 30/65 257/E29.256

FOREIGN PATENT DOCUMENTS

CN 1910747 A * 2/2007
JP H07-193018 A 7/1995

OTHER PUBLICATIONS

CN-1910747-A, English translation, Yamanaka, (Year: 2007).*

* cited by examiner

*Primary Examiner* — Igwe U Anya
(74) *Attorney, Agent, or Firm* — Rimon P.C.

(57) ABSTRACT

A semiconductor substrate exposed from an oxidation-resistant mask layer is thermally oxidized to form a field oxidation film. The mask layer has multiple mask parts with a first width and multiple mask parts with a second width smaller than the first width. In the thermal oxidation process, an oxidation film is formed integrally with the field oxidation film under the mask part, and an oxidation film is formed integrally with the field oxidation film under the mask part. After removing the mask layer, plurality of p-type semiconductor regions is formed by ion-implantation into the semiconductor substrate using the field oxidation film as a mask. The plurality of p-type semiconductor regions includes a first semiconductor region formed under the oxidation film and a second semiconductor region formed under the oxidation film, and the depth of the second semiconductor region is shallower than the depth of the first semiconductor region.

18 Claims, 22 Drawing Sheets

METHOD OF MANUFACTURING SEMICONDUCTOR DEVICE

CROSS-REFERENCE TO RELATED APPLICATIONS

The disclosure of Japanese Patent Application No. 2023-028637 filed on Feb. 27, 2023, including the specification, drawings and abstract is incorporated herein by reference in its entirety.

BACKGROUND

The present invention relates to a manufacturing method of a semiconductor device, which can be suitably used, for example, in the manufacturing method of a semiconductor device having a diode.

In high withstand voltage semiconductor devices, a terminal structure for improving the breakdown voltage is provided. As a terminal structure to improve the breakdown voltage, there are RESURF (Reduced Surface Field) structure and VLD (Variation of Lateral Doping) structure.

For example, Japanese Patent Laid-Open No. 7-193018 (Patent Document 1) describes a technology related to the manufacturing method of the VLD structure.

SUMMARY

Compared to the RESURF structure, the VLD structure can more effectively mitigate electric field concentration and can increase the breakdown voltage of the semiconductor device.

It is desirable to be able to accurately manufacture a semiconductor device with a VLD structure.

Other objects and novel features will become apparent from the description of this specification and the accompanying drawings.

According to one embodiment, the manufacturing method of the semiconductor device includes the steps of: (a) preparing a semiconductor substrate having an active region and a peripheral region; (b) selectively forming an oxidation-resistant mask layer on a main surface of the semiconductor substrate in the peripheral region; (c) forming a field oxide film in the peripheral region by thermally oxidizing the semiconductor substrate exposed from the oxidation-resistant mask layer. The manufacturing method of the semiconductor device further includes: (d) removing the oxidation-resistant mask layer; (e) after the step (d), forming a plurality of first conductivity type semiconductor regions in the peripheral region by ion-implanting first conductivity type impurities into the main surface of the semiconductor substrate using the field oxide film as a mask for impurity introduction. The oxidation-resistant mask layer includes a plurality of first portions having a first width and a plurality of second portions having a second width smaller than the first width. In the step (c), a first oxide film is integrally formed with the field oxide film under the plurality of first portions of the oxidation-resistant mask layer, and a second oxide film thicker than the first oxide film is integrally formed with the field oxide film under the plurality of second portions of the oxidation-resistant mask layer. The plurality of semiconductor regions includes a first semiconductor region formed under the first oxide film and a second semiconductor region formed under the second oxide film, and a depth of the second semiconductor region is shallower than a depth of the first semiconductor region.

According to one embodiment, it is possible to accurately manufacture a semiconductor device with a VLD structure.

BRIEF DESCRIPTION OF THE DRAWINGS

FIG. 1 is a top view of a semiconductor device in one embodiment.

FIG. 3 is a plan view of a semiconductor device in one embodiment.

FIG. 5 is a cross-sectional view of the main portion of a semiconductor device in one embodiment.

DETAILED DESCRIPTION

Figure 2:
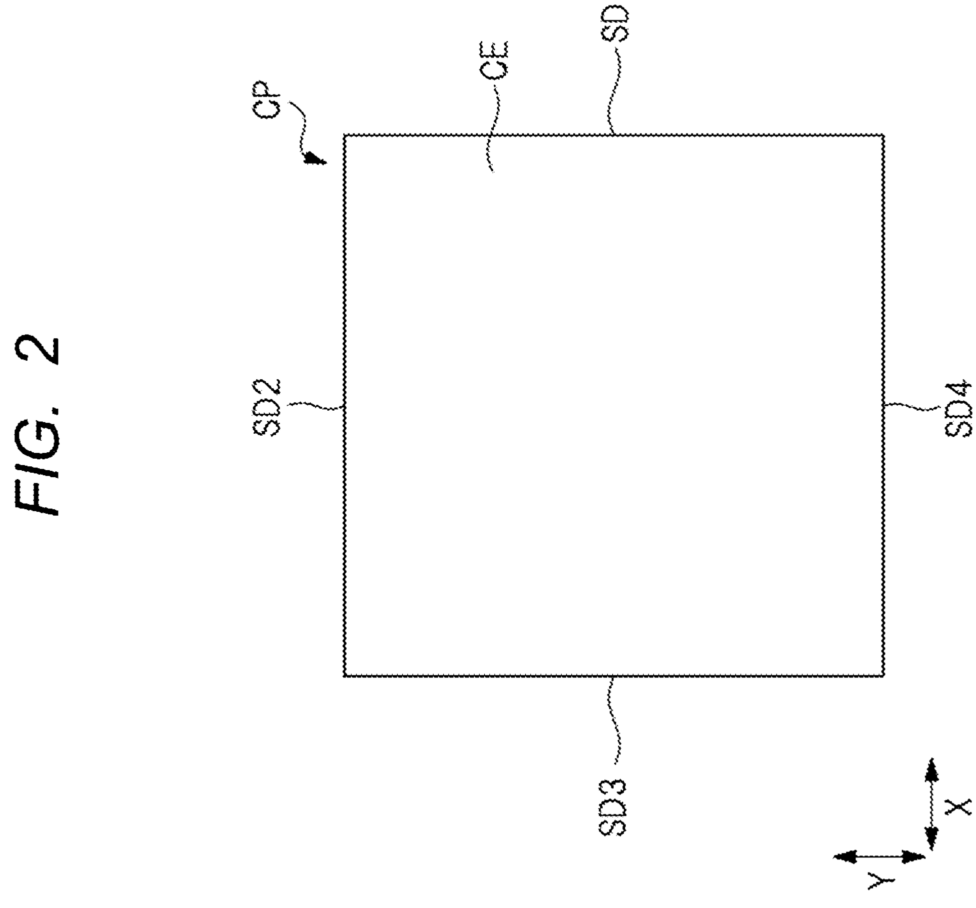
FIG. 2 is a bottom view of a semiconductor device in one embodiment.

In the following embodiments, when required for convenience, the description will be made by dividing into a plurality of sections or embodiments, but except when specifically stated, they are not independent of each other, and one is related to the modified example, detail, supplementary description, or the like of part or all of the other. In the following embodiments, the number of elements, etc. (including the number of elements, numerical values, quantities, ranges, etc.) is not limited to the specific number, but may be not less than or equal to the specific number, except for cases where the number is specifically indicated and is clearly limited to the specific number in principle. Furthermore, in the following embodiments, it is needless to say that the constituent elements (including element steps and the like) are not necessarily essential except in the case where they are specifically specified and the case where they are considered to be obviously essential in principle. Similarly, in the following embodiments, when referring to the shapes, positional relationships, and the like of components and the like, it is assumed that the shapes and the like are substantially approximate to or similar to the shapes and the like, except for the case in which they are specifically specified and the case in which they are considered to be obvious in principle, and the like. The same applies to the above numerical values and ranges.

Hereinafter, embodiments will be described in detail refer to the drawings. Note that, in all the drawings for explaining the embodiments, members having the same functions are denoted by the same reference numerals, and repetitive descriptions thereof are omitted. And in the following embodiments, descriptions of the same or similar parts will not be repeated in principle except when particularly necessary.

In the drawings used in the embodiments, hatching may be omitted even in the case of cross-sectional view in order to make the drawings easier to see. Also, even in the case of a plan view, hatching may be used to make the drawing easier to see.

(A Structure of a Semiconductor Device)

Figure 1:
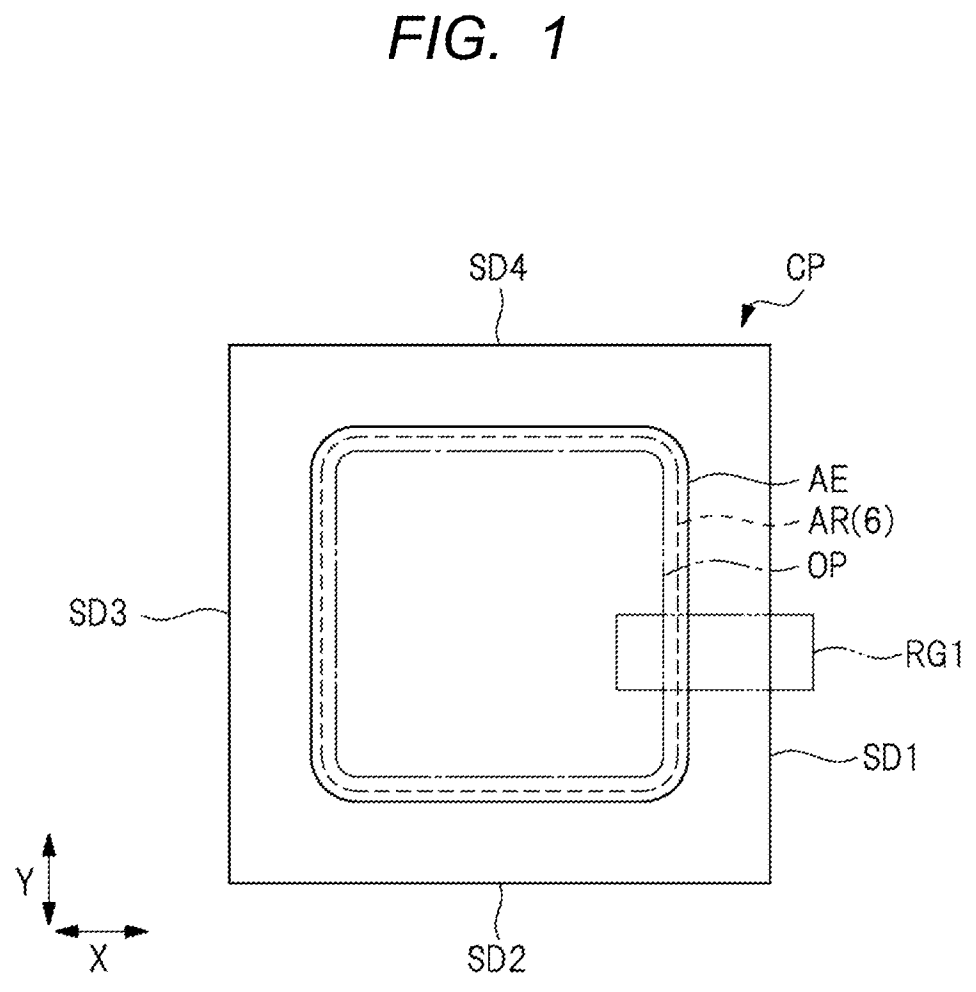
Figure 3:
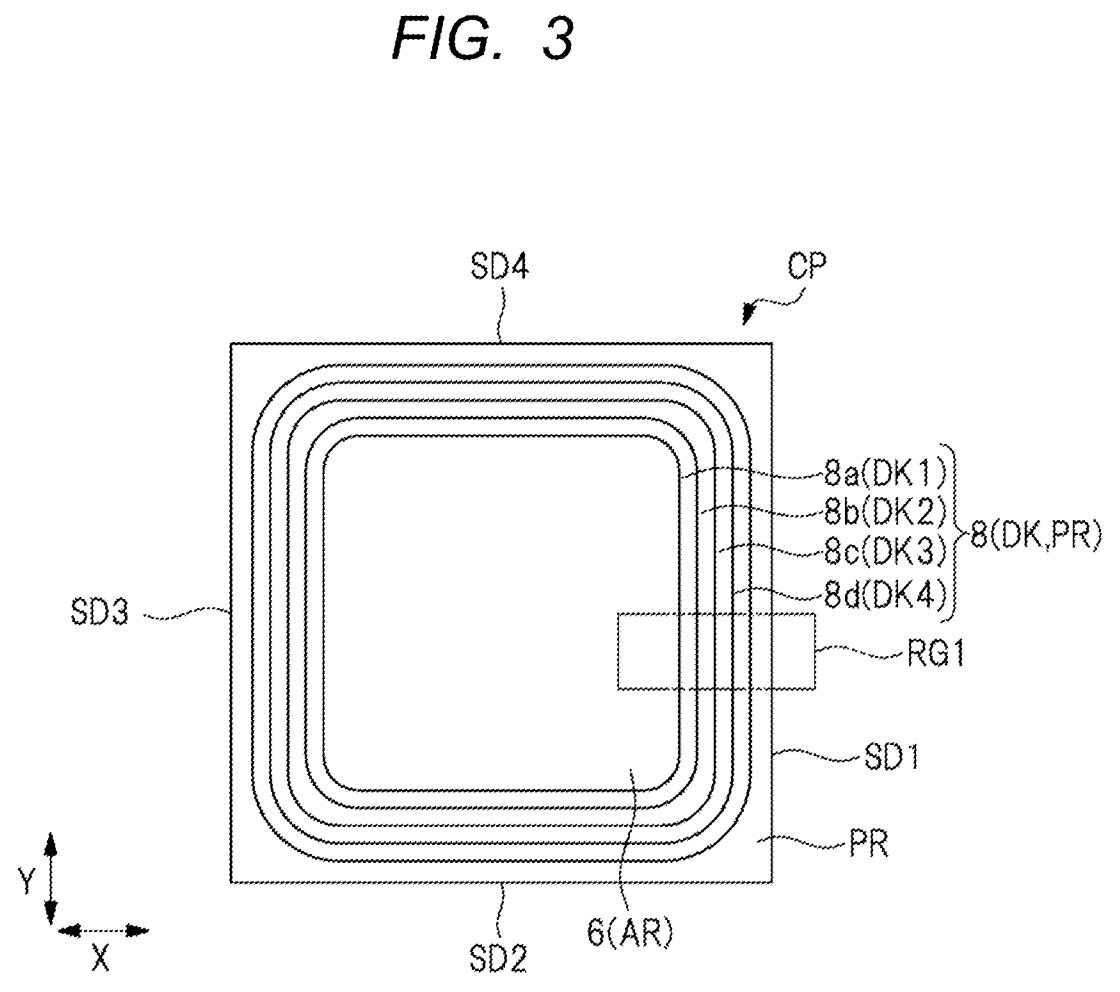
Figure 4:
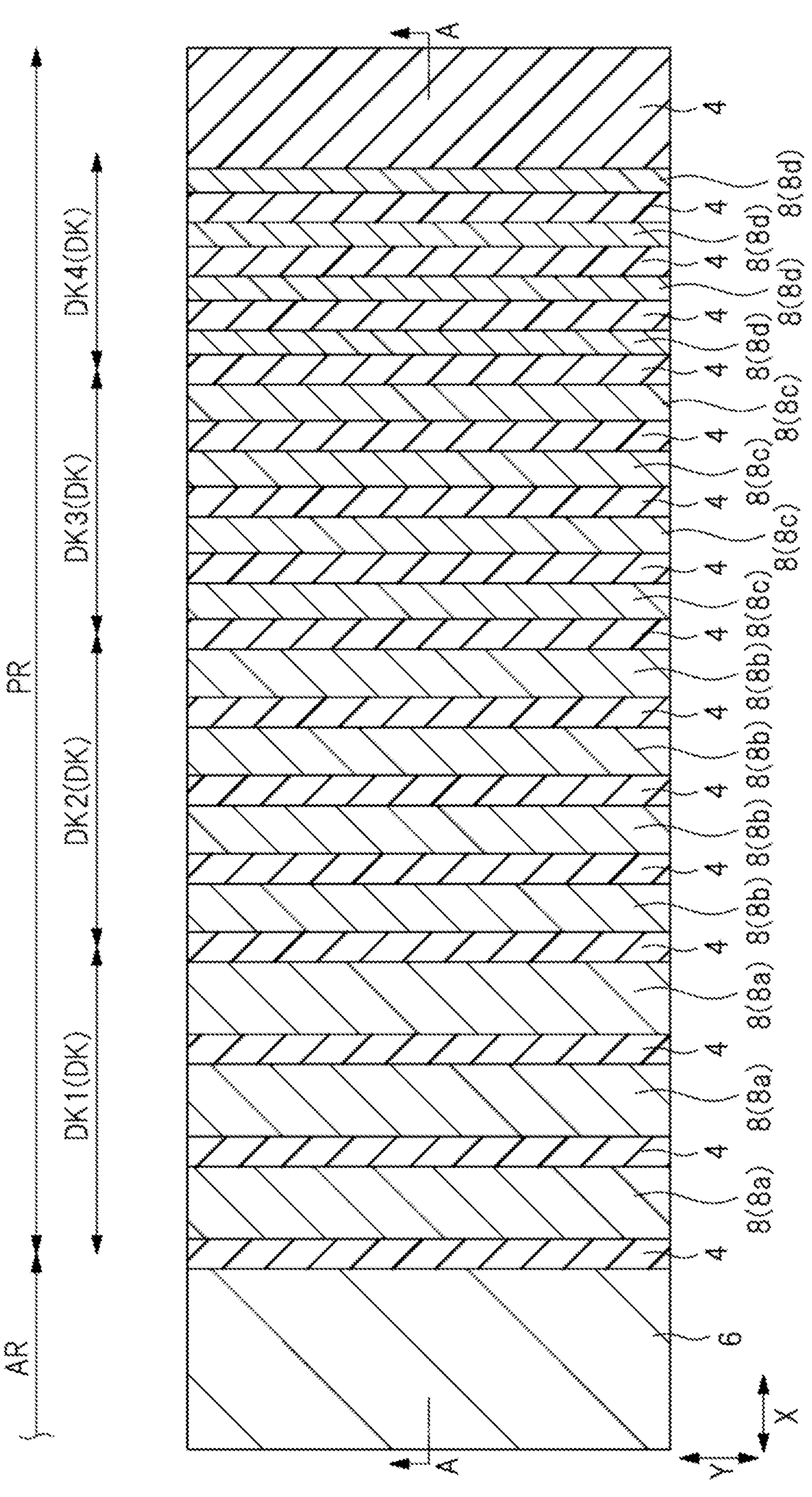
FIG. 4 is a cross-sectional view of the main portion of a semiconductor device in one embodiment.
Figure 5:
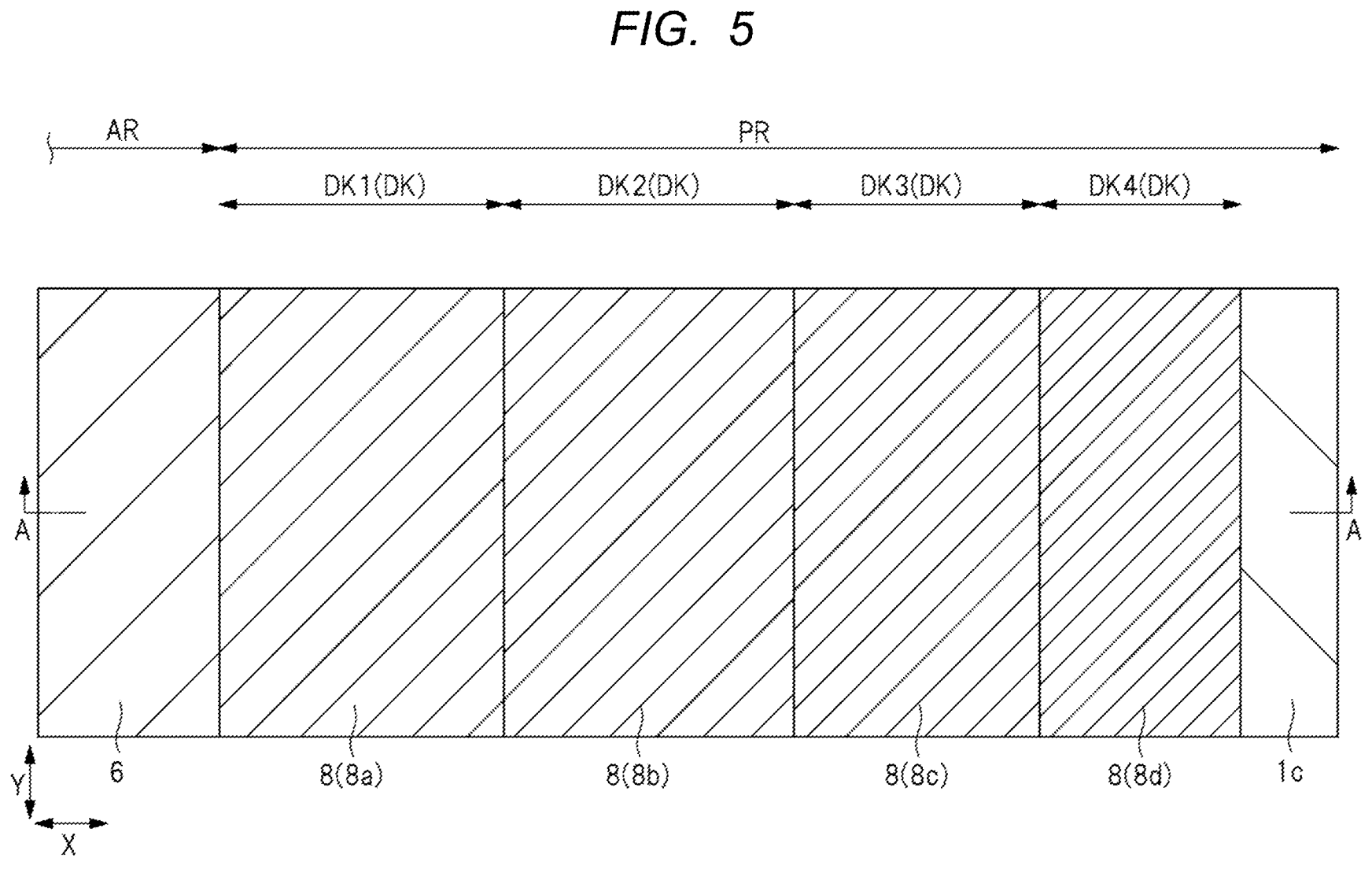
Figure 6:
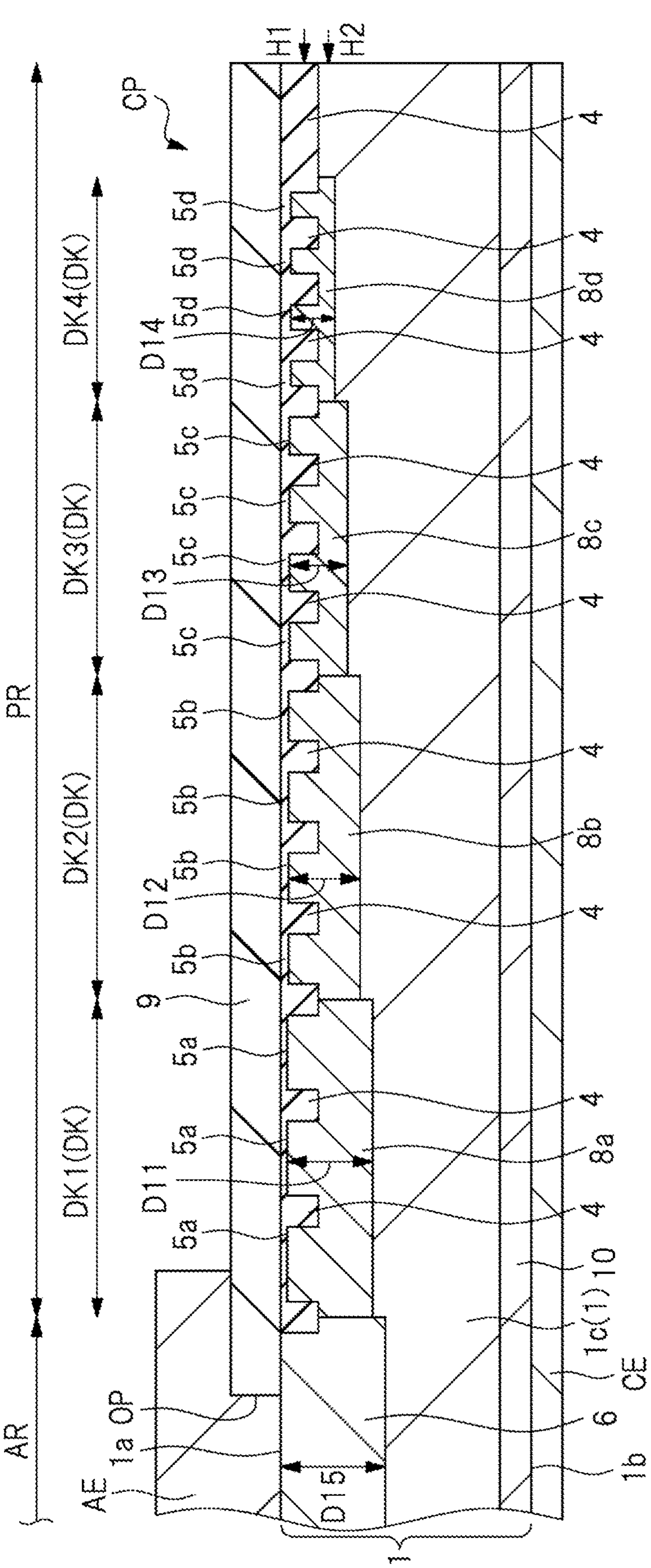
FIG. 6 is a cross-sectional view of the main portion of a semiconductor device in one embodiment.

The structure of the semiconductor device CP of the present embodiment will be described with reference to FIGS. 1 to 6. FIG. 1 is a plan view of the semiconductor device CP of the present embodiment, and FIG. 2 is a bottom view (bottom view) of the semiconductor device CP of the present embodiment. To facilitate understanding, in FIG. 1, the anode electrode AE is shown by a solid line, an active region AR is shown by a dotted line, and the position of the opening OP of the insulating film 9 (see FIG. 6) is shown by a dotted chain line. FIG. 3 is a plan perspective view of the semiconductor device CP of the present embodiment. FIGS. 4 to 6 are cross-sectional views of the main portion of the semiconductor device CP of the present embodiment. In FIGS. 4 and 5, a cross section substantially parallel to a main surface 1*a* or a bottom surface 1*b* of a semiconductor substrate 1 constituting the semiconductor chip CP is shown, and in FIG. 6, a cross section substantially perpendicular to the main surface 1*a* or the bottom surface 1*b* of the semiconductor substrate 1 constituting the semiconductor chip CP is shown. What is shown in FIGS. 4 and 5 is a cross-sectional view of the region RG1 shown in FIGS. 1 and 3, and what is shown in FIG. 6 corresponds to a cross-sectional view at the position of the line A-A shown in FIGS. 4 and 5. Note that FIGS. 4 and 5 differ in height (depth) position, with FIG. 4 corresponding to the cross-sectional view at height position H1 shown in FIG. 6, and FIG. 5 corresponding to the cross-sectional view at height position H2 shown in FIG. 6. The X and Y directions shown in FIGS. 1 to 5, etc., are directions approximately parallel to the main surface 1*a* or the bottom surface 1*b* of the semiconductor substrate 1, and the X and Y directions are directions orthogonal to each other.

The semiconductor device (semiconductor chip) CP of the present embodiment is a semiconductor device equipped with a diode, and the diode is formed on the semiconductor substrate 1 constituting the semiconductor device CP.

The semiconductor device CP comprises the semiconductor substrate 1, an insulating film (interlayer insulating film, protective film) 9 and an anode electrode AE formed on the main surface 1*a* of the semiconductor substrate 1, and a cathode electrode CE formed on the bottom surface 1*b* of the semiconductor substrate 1. The semiconductor substrate 1, which constitutes the semiconductor device CP, is made of silicon (more specifically, monocrystalline silicon), and has the main surface 1*a* and the bottom surface 1*b* on the opposite side of the main surface 1*a*. The anode electrode AE and the cathode electrode CE are each made of a metal material.

The semiconductor device CP and the semiconductor substrate 1 constituting it have a rectangular planar shape. Specifically, the semiconductor device CP and the semiconductor substrate 1 constituting it have side surfaces SD1, SD3 substantially parallel to the Y direction, and side surfaces SD2, SD4 substantially parallel to the X direction, and the side surfaces SD1 and SD3 are located on opposite sides of each other, and the side surfaces SD2 and SD4 are located on opposite sides of each other.

The semiconductor substrate 1 is an n-type semiconductor substrate, but a p-type semiconductor region (p-type anode region, p-type body region) 6 for the anode of a diode is formed in the semiconductor substrate 1. The p-type semiconductor region 6 is formed close to on the main surface 1*a* of the semiconductor substrate 1, and is formed over a predetermined depth from the main surface 1*a* of the semiconductor substrate 1. The p-type semiconductor region 6 has a substantially uniform (constant) thickness. In plan view, the p-type semiconductor region 6 is formed in the central region of the semiconductor substrate 1 and is spaced from the side surfaces SD1, SD2, SD3, SD4 of the semiconductor substrate 1.

In this application, a plan view corresponds to a case where the main surface or the bottom surface of the semiconductor device CP, or the main surface 1*a* or the bottom surface 1*b* of the semiconductor substrate 1 is viewed in a plane parallel to it. Also, the thickness direction, depth direction, and height direction of the semiconductor substrate 1 are the same as each other. Also, the thickness direction of the semiconductor substrate 1 is a direction substantially perpendicular to the main surface 1*a* or the bottom surface 1*b* of the semiconductor substrate 1. Also, the horizontal direction is a direction parallel to the main surface 1*a* or the bottom surface 1*b* of the semiconductor substrate 1.

On the main surface 1*a* of the semiconductor substrate 1, an insulating film 9 and an anode electrode AE are formed, and the anode electrode AE is electrically connected to the p-type semiconductor region 6. Specifically, an opening OP exposing the p-type semiconductor region 6 is formed in the insulating film 9, and the anode electrode AE is formed on the p-type semiconductor region 6 exposed from the opening OP. Therefore, the anode electrode AE is in contact with the p-type semiconductor region 6 exposed from the opening OP and is electrically connected to the p-type semiconductor region 6. A part (peripheral part) of the anode electrode AE is located on the insulating film 9.

The opening OP is contained within the anode electrode AE and the p-type semiconductor region 6 in a plan view. In a plan view, the anode electrode AE has a planar shape that is approximately the same as or slightly larger than the p-type semiconductor region 6.

On the bottom surface 1*b* of the semiconductor substrate 1, an n-type semiconductor region (n-type cathode region) 10 for the cathode of the diode is formed. An n-type semiconductor region 10 is formed over a predetermined depth from the bottom surface 1*b* of the semiconductor substrate 1. The n-type semiconductor region 10 is formed over an entire bottom surface 1*b* of the semiconductor substrate 1 and has a nearly uniform (constant) thickness. The cathode electrode CE is formed over the entire bottom surface 1*b* of the semiconductor substrate 1 and is in contact with and electrically connected to the n-type semiconductor region 10.

In the semiconductor substrate 1, the n-type substrate region 1*c* of the semiconductor substrate 1 is interposed between the p-type semiconductor region 6 and the n-type semiconductor region 10. A PN junction is formed between the p-type semiconductor region 6 and the n-type substrate region 1*c*. The impurity concentration (n-type impurity concentration) of the n-type semiconductor region 10 is higher than the impurity concentration (n-type impurity concentration) of the n-type substrate region 1*c*. Therefore, the n-type substrate region 1*c* is a low impurity concentration n-type region, and the n-type semiconductor region 10 is a high impurity concentration n-type region.

A diode is formed by the p-type semiconductor region 6, the n-type semiconductor region 10, and the n-type substrate region 1*c* between the p-type semiconductor region 6 and the n-type semiconductor region 10. The p-type semiconductor region 6 functions as the anode region of the diode. The n-type substrate region 1*c* and the n-type semiconductor region 10 function as the cathode region of the diode. Therefore, current can flow through the p-type semiconductor region 6, the n-type substrate region 1*c*, and the n-type semiconductor region 10 between the anode electrode AE and the cathode electrode CE. That is, current flows in the thickness direction of the semiconductor substrate 1 between the anode electrode AE and the cathode electrode CE.

In the semiconductor substrate 1, the region that functions as an active element (here, a diode) is referred to as the active region AR. In the semiconductor substrate 1, the active region AR is composed of the p-type semiconductor region 6 and the region below the p-type semiconductor region 6 (the portion located below the p-type semiconductor region 6 among the n-type substrate region 1*c* and the n-type semiconductor region 10). That is, the region overlapping with the p-type semiconductor region 6 in a plan view of the semiconductor substrate 1 corresponds to the active region AR. Therefore, in a plan view, the active region AR coincides with the p-type semiconductor region 6.

The planar shape of the p-type semiconductor region 6 (and thus the planar shape of the active region AR) is, for example, approximately rectangular, but the corners of the rectangle can also be rounded. That is, a rectangular planar shape with arcuate corners can be applied as the planar shape of the p-type semiconductor region 6.

The region surrounding the active region AR in plan view within the semiconductor substrate 1 is referred to as a peripheral region PR. That is, the region between the active region AR and the side surfaces SD1, SD2, SD3, SD4 of the semiconductor substrate 1 corresponds to the peripheral region PR. In plan view, the peripheral region PR is arranged to surround the active region AR.

In the peripheral region PR of the semiconductor substrate 1, a p-type semiconductor region (field relaxation layer) 8 for field relaxation is formed. The p-type semiconductor region 8 is formed on the 1*a* side of the main surface of the semiconductor substrate 1 and is formed to a predetermined depth from the main surface 1*a* of the semiconductor substrate 1. The p-type semiconductor region 8 is adjacent to the p-type semiconductor region 6 and is formed to surround the p-type semiconductor region 6 in plan view. In plan view, the p-type semiconductor region 8 is spaced apart from the side surfaces SD1, SD2, SD3, SD4 of the semiconductor substrate 1.

The p-type semiconductor region 8 is composed of p-type semiconductor regions 8*a*, 8*b*, 8*c*, and 8*d*.

In the semiconductor substrate 1, the region overlapping with the p-type semiconductor region 8*a* in plan view is referred to as region DK1, the region overlapping with the p-type semiconductor region 8*b* in plan view is referred to as region DK2, the region overlapping with the p-type semiconductor region 8*c* in plan view is referred to as region DK3, and the region overlapping with the p-type semiconductor region 8*d* in plan view is referred to as region DK4. Also, within the semiconductor substrate 1, the region overlapping with the p-type semiconductor region 8 in plan view is referred to as region DK, but the region DK corresponds to the region combining regions DK1, DK2, DK3, and DK4.

The p-type semiconductor region 8*a* is located on the outer periphery of the p-type semiconductor region 6 and is adjacent to the p-type semiconductor region 6, and is formed so as to surround the p-type semiconductor region 6 in a plan view. The p-type semiconductor region 8*b* is located on the outer periphery of the p-type semiconductor region 8*a* and is adjacent to the p-type semiconductor region 8*a*, and is formed so as to surround the p-type semiconductor region 8*a* in a plan view. The p-type semiconductor region 8*c* is located on the outer periphery of the p-type semiconductor region 8*b* and is adjacent to the p-type semiconductor region 8*b*, and is formed so as to surround the p-type semiconductor region 8*b* in a plan view. The p-type semiconductor region 8*d* is located on the outer periphery of the p-type semiconductor region 8*c* and is adjacent to the p-type semiconductor region 8*c*, and is formed so as to surround the p-type semiconductor region 8*c* in a plan view. In a plan view, the p-type semiconductor region 8*a* is located between the p-type semiconductor region 6 and the p-type semiconductor region 8*b*, and the p-type semiconductor region 8*b* is located between the p-type semiconductor region 8*a* and the p-type semiconductor region 8*c*, and the p-type semiconductor region 8*c* is located between the p-type semiconductor region 8*b* and the p-type semiconductor region 8*d*.

In other words, the p-type semiconductor regions 8*a*, 8*b*, 8*c*, 8*d* (regions DK1, DK2, DK3, DK4) each have a frame-like planar shape. And, the inner periphery of the p-type semiconductor region 8*a* (region DK1) is adjacent to the outer periphery of the p-type semiconductor region 6 (active region AR). Also, the inner periphery of the p-type semiconductor region 8*b* (region DK2) is adjacent to the outer periphery of the p-type semiconductor region 8*a* (region DK1). Also, the inner periphery of the p-type semiconductor region 8*c* (region DK3) is adjacent to the outer periphery of the p-type semiconductor region 8*b* (region DK2). Also, the inner periphery of the p-type semiconductor region 8*d* (region DK4) is adjacent to the outer periphery of the p-type semiconductor region 8*c* (region DK3).

The impurity concentration (p-type impurity concentration) of the p-type semiconductor region 8*a* is lower than the impurity concentration (p-type impurity concentration) of the p-type semiconductor region 6, and the depth D11 of the p-type semiconductor region 8*a* is shallower than the depth D15 of the p-type semiconductor region 6 (D15>D11). Also, the impurity concentration (p-type impurity concentration) of the p-type semiconductor region 8*b* is lower than the impurity concentration (p-type impurity concentration) of the p-type semiconductor region 8*a*, and the depth D12 of the p-type semiconductor region 8*b* is shallower than the depth D11 of the p-type semiconductor region 8*a* (D11>D12). Also, the impurity concentration (p-type impurity concentration) of the p-type semiconductor region 8*c* is lower than the impurity concentration (p-type impurity concentration) of the p-type semiconductor region 8*b*, and the depth D13 of the p-type semiconductor region 8*c* is shallower than the depth D12 of the p-type semiconductor region 8*b* (D12>D13). Also, the impurity concentration (p-type impurity concentration) of the p-type semiconductor region 8*d* is lower than the impurity concentration (p-type impurity concentration) of the p-type semiconductor region 8*c*, and the depth D14 of the p-type semiconductor region 8*d* is shallower than the depth D13 of the p-type semiconductor region 8*c* (D13>D14). In other words, the depth position of a bottom surface of the p-type semiconductor region 8*a* is shallower than the depth position of a bottom surface of the p-type semiconductor region 6, the depth position of a bottom surface of the p-type semiconductor region 8*b* is shallower than the depth position of the bottom surface of the p-type semiconductor region 8*a*, the depth position of a bottom surface of the p-type semiconductor region 8*c* is shallower than the depth position of the bottom surface of the p-type semiconductor region 8*b*, and the depth position of a bottom surface of the p-type semiconductor region 8*d* is shallower than the depth position of the bottom surface of the p-type semiconductor region 8*c*. The depth D15 of the p-type semiconductor region 6 can be, for example, about 4 to 10 micrometers. When referring to the depth position in the semiconductor substrate 1, the side closer to the bottom surface 1*b* of the semiconductor substrate 1 is considered the deep side, and the side farther from the bottom surface 1*b* of the semiconductor substrate 1 is considered the shallow side.

In other words, from a position adjacent to the p-type semiconductor region 6, on the side facing the side surfaces SD1, SD2, SD3, SD4 of the semiconductor substrate 1, the p-type semiconductor regions 8*a*, 8*b*, 8*c*, and 8*d* are arranged in sequence, in this order, the p-type impurity concentration decreases, and the depth becomes shallower. As a result, the p-type impurity concentration of the p-type semiconductor region 8 for electric field relaxation decreases gradually from a position adjacent to the p-type semiconductor region 6 as it moves away from the p-type semiconductor region 6 (i.e., as it moves towards the side surfaces SD1, SD2, SD3, SD4). Also, the depth of the p-type semiconductor region 8 for electric field relaxation gradually becomes shallower from a position adjacent to the p-type semiconductor region 6 as it moves away from the p-type semiconductor region 6 (i.e., as it moves towards the side surfaces SD1, SD2, SD3, SD4). In other words, the p-type semiconductor region 8 has a VLD structure. Therefore, compared to when the p-type semiconductor region 8 does not have a VLD structure (when the p-type semiconductor region 8 has a RESURF structure), which is different from the present embodiment, the semiconductor device CP of the present embodiment can more effectively relax the electric field concentration in the peripheral region PR of the semiconductor substrate 1, and can increase the breakdown voltage of the semiconductor device CP.

Note that, unlike the present embodiment, when the p-type semiconductor region 8 has a RESURF structure, the p-type impurity concentrations of the p-type semiconductor regions 8*a*, 8*b*, 8*c*, and 8*d* are the same, and the depths of the p-type semiconductor regions 8*a*, 8*b*, 8*c*, and 8*d* are the same.

Also, a field oxide film (LOCOS film) 4 is formed on the main surface 1*a* of the semiconductor substrate 1. The field oxide film 4 is made of silicon oxide and is formed by the LOCOS (Local Oxidation of Silicon) method. On the main surface 1*a* of the semiconductor substrate 1, the field oxide film 4 is mainly formed in the peripheral region PR. The insulating film 9 is formed on the main surface 1*a* of the semiconductor substrate 1 so as to cover the field oxide film 4. The field oxide film 4 formed in the peripheral region PR of the semiconductor substrate 1 is used to accurately form the p-type semiconductor region 8 with a VLD structure, as described later.

In the region DK1, the p-type semiconductor region 8*a* is continuously formed between adjacent the field oxide film 4 and under the field oxide film 4. In the region DK2, the p-type semiconductor region 8*b* is continuously formed between adjacent the field oxide film 4 and under the field oxide film 4. In the region DK3, the p-type semiconductor region 8*c* is continuously formed between adjacent the field oxide film 4 and under the field oxide film 4. In the region DK4, the p-type semiconductor region 8*d* is continuously formed between adjacent the field oxide film 4 and under the field oxide film 4.

In the region DK1, an oxide film 5*a*, which is integrally formed with the field oxide film 4, is formed on the surface of the p-type semiconductor region 8*a* between adjacent the field oxide film 4. In the region DK2, an oxide film 5*b*, which is integrally formed with the field oxide film 4, is formed on the surface of the p-type semiconductor region 8*b* between adjacent the field oxide film 4. In the region DK3, an oxide film 5*c*, which is integrally formed with the field oxide film 4, is formed on the surface of the p-type semiconductor region 8*c* between adjacent the field oxide film 4. In the region DK4, an oxide film 5*d*, which is integrally formed with the field oxide film 4, is formed on the surface of the p-type semiconductor region 8*d* between adjacent the field oxide film 4. The oxide films 5*a*, 5*b*, 5*c*, and 5*d* are each made of silicon oxide.

(A Manufacturing Method of the Semiconductor Device)

Figure 8:
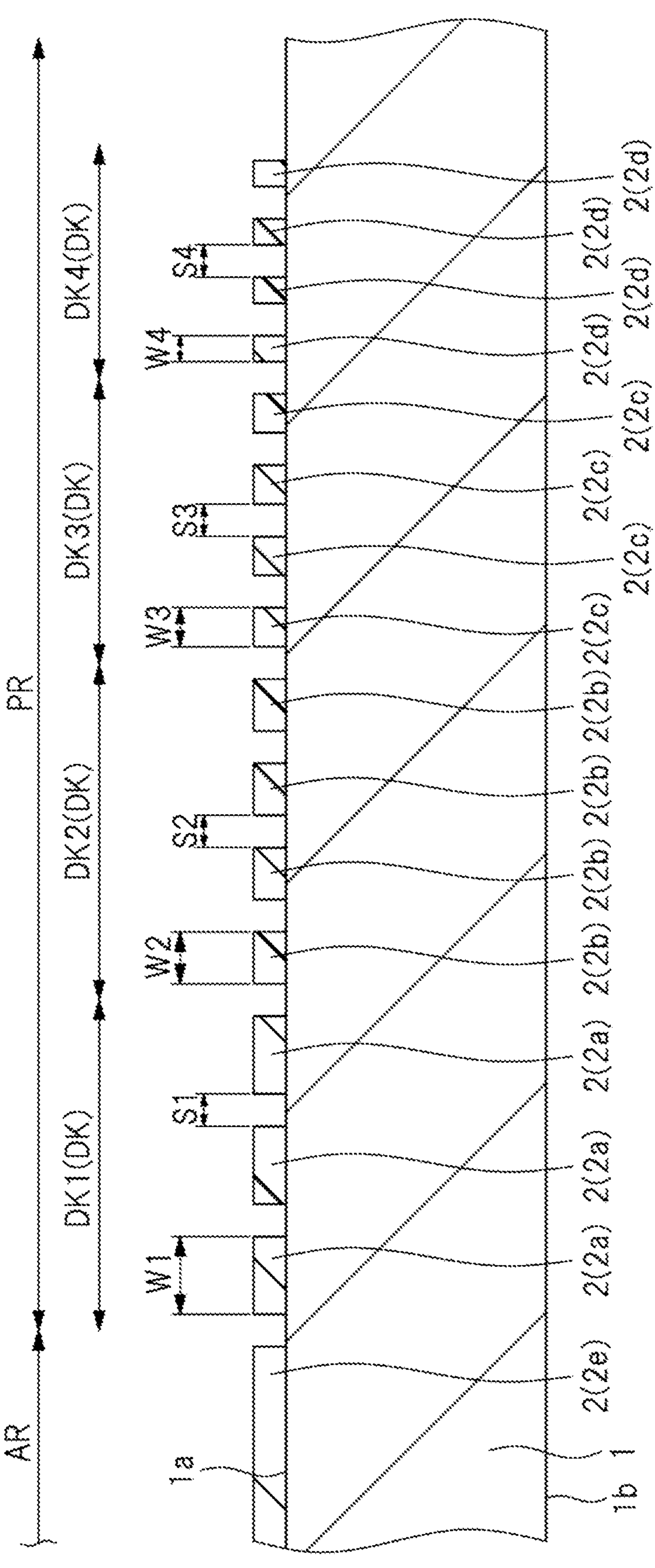
FIG. 8 is a cross-sectional view of the main portion of a semiconductor device during the manufacturing process following FIG. 7.
Figure 9:
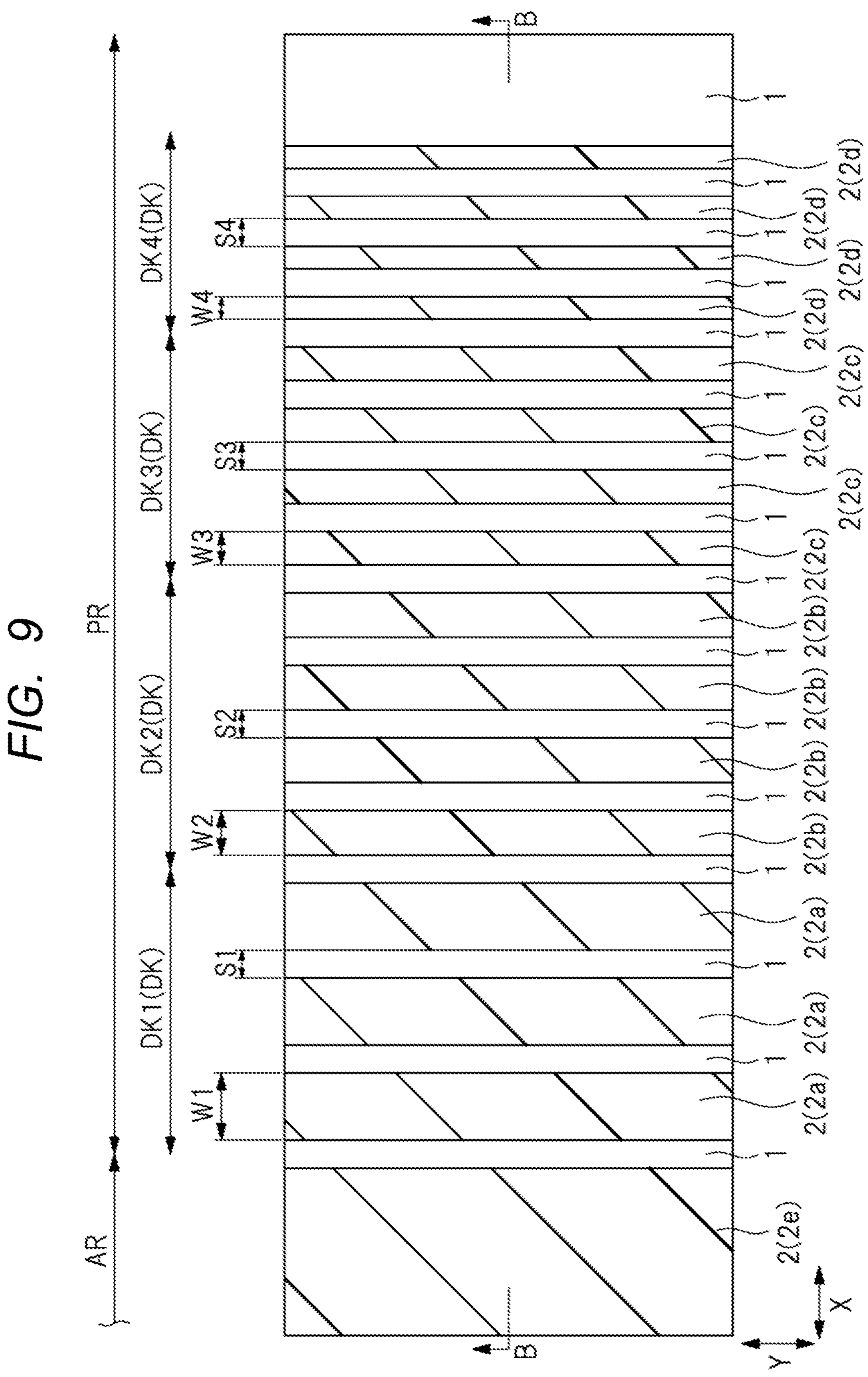
FIG. 9 is a plan view of the main portion of the same semiconductor device during the manufacturing process as in FIG. 8.
Figure 13:
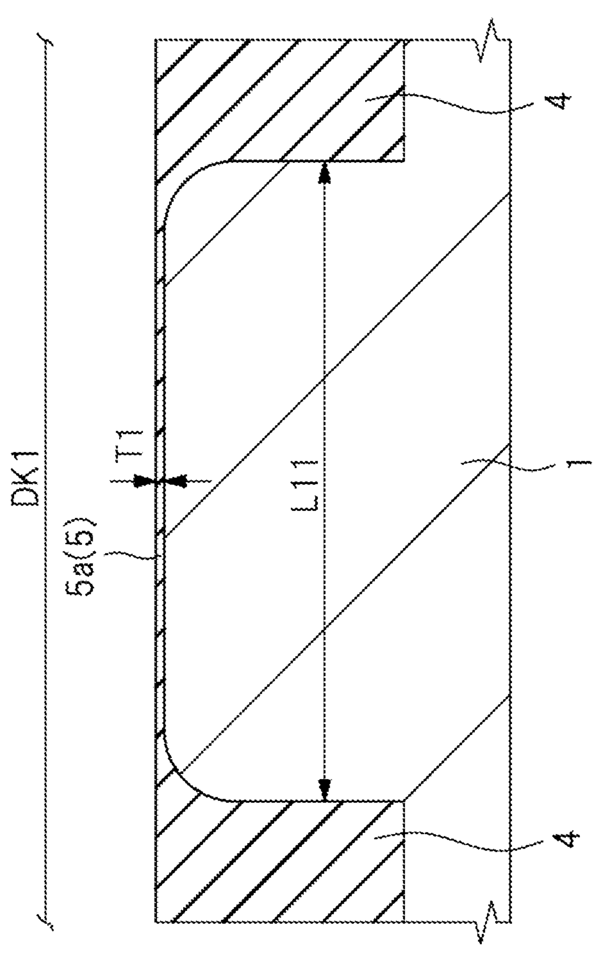
FIG. 13 is a magnified cross-sectional view showing a part of FIG. 12.
Figure 14:
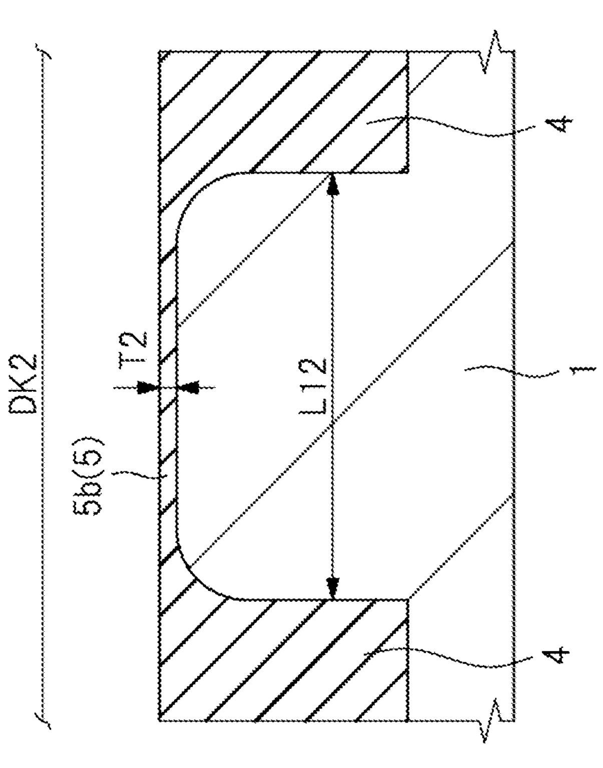
FIG. 14 is a magnified cross-sectional view showing a part of FIG. 12.
Figure 15:
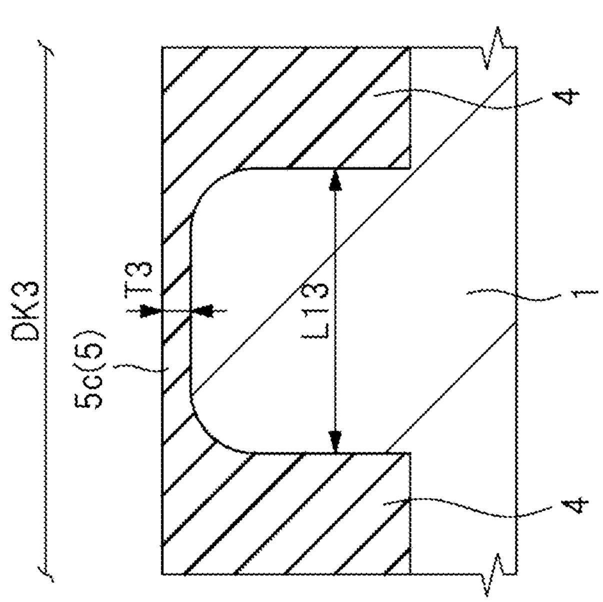
FIG. 15 is a magnified cross-sectional view showing a part of FIG. 12.
Figure 16:
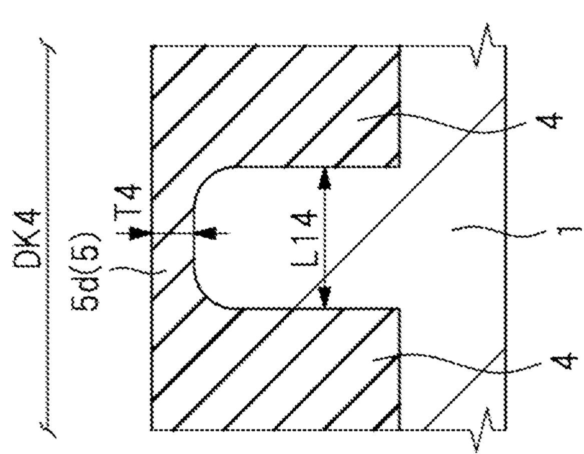
FIG. 16 is a magnified cross-sectional view showing a part of FIG. 12.

The manufacturing method of the semiconductor device CP of the present embodiment will be explained with reference to FIGS. 7 to 22. FIGS. 7, 8, 10 to 12, and 17 to 22 are cross-sectional views of the main portions during the manufacturing process of the semiconductor device CP of the present embodiment, showing cross-sections corresponding to the above FIG. 6. FIG. 9 is a plan view of the main portion during the manufacturing process of the semiconductor device CP of the present embodiment, showing a plan view of the region corresponding to the region RG1 shown in the above FIGS. 1 and 3. Therefore, the planar region shown in FIG. 9 is almost identical to the planar region shown in the above FIGS. 4 and 5, but the above FIGS. 4 and 5 are cross-sectional views parallel to the main surface 1*a* of the semiconductor substrate 1, and FIG. 9 is a plan view when viewed from above the main surface 1*a* of the semiconductor substrate 1. FIG. 8 corresponds to the cross-sectional view at the position of the line B-B shown in FIG. 9. FIGS. 13 to 16 are partial enlarged cross-sectional views showing a part of FIG. 12 enlarged, with FIG. 13 showing a part of the region DK1 enlarged, FIG. 14 showing a part of the region DK2 enlarged, FIG. 15 showing a part of the region DK3 enlarged, and FIG. 16 showing a part of the region DK4 enlarged.

Figure 7:
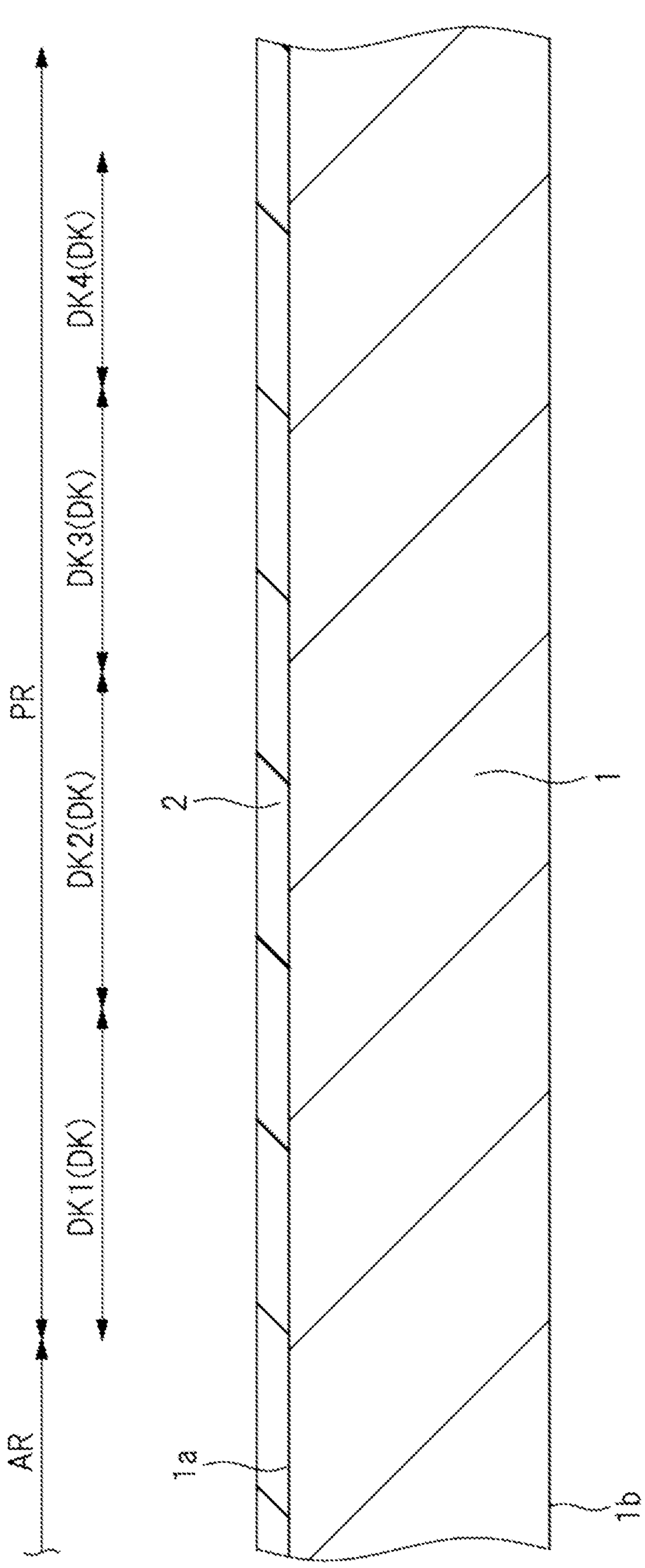
FIG. 7 is a cross-sectional view of the main portion of a semiconductor device during the manufacturing process in one embodiment.

First, as shown in FIG. 7, the semiconductor substrate 1 is prepared. At this stage, the semiconductor substrate 1 is a semiconductor wafer that is substantially circular in plan view. The semiconductor substrate 1 has the main surface 1*a* and the bottom surface 1*b* on the opposite side. The semiconductor substrate 1 is made of silicon (more specifically, monocrystalline silicon). An n-type semiconductor substrate into which n-type impurities have been introduced can be used as the semiconductor substrate 1. The n-type impurity concentration of the semiconductor substrate 1 is lower than the n-type impurity concentration of the n-type semiconductor region 10 to be formed later.

At this stage, the p-type semiconductor regions 6, 8*a*, 8*b*, 8*c*, 8*d* and the n-type semiconductor region 10 have not yet been formed on the semiconductor substrate 1. Therefore, an entire semiconductor substrate 1 is a n-type impurity concentration region equivalent to the n-type substrate region 1*c*. Thus, the active region AR corresponds to the planned formation area of the p-type semiconductor region 6 on the semiconductor substrate 1. Also, region DK1 corresponds to the planned formation area of the p-type semiconductor region 8*a* on the semiconductor substrate 1, and region DK2 corresponds to the planned formation area of the p-type semiconductor region 8*b* on the semiconductor substrate 1. Furthermore, region DK3 corresponds to the planned formation area of the p-type semiconductor region 8*c* on the semiconductor substrate 1, and region DK4 corresponds to the planned formation area of the p-type semiconductor region 8*d* on the semiconductor substrate 1. As described above, in plan view, region DK1 surrounds the active region AR, region DK2 surrounds the region DK1, region DK3 surrounds the region DK2, and region DK4 surrounds the region DK3.

Next, as shown in FIG. 7, a silicon nitride film 2 is formed on the main surface 1*a* of the semiconductor substrate 1. The silicon nitride film 2 can be formed using methods such as CVD (Chemical Vapor Deposition). At this stage, the silicon nitride film 2 is formed over an entire main surface 1*a* of the semiconductor substrate 1.

Next, as shown in FIGS. 8 and 9, the silicon nitride film 2 is patterned using photolithography and etching techniques. This forms a mask layer (oxidation-resistant mask layer) made of the patterned silicon nitride film 2. Hereinafter, the mask layer made of the patterned silicon nitride film 2 is referred to as the mask layer 2. As shown in FIG. 8, the mask layer 2 is formed on the main surface 1*a* of the semiconductor substrate 1. The mask layer 2 is formed over the entire main surface 1*a* of the semiconductor substrate 1 in the active region AR, but in the peripheral region PR, it is selectively formed on the main surface 1*a* of the semiconductor substrate 1, not over the entire main surface 1*a*.

As shown in FIGS. 8 and 9, the mask layer 2 includes multiple mask parts 2*a* formed on the semiconductor substrate 1 in region DK1, multiple mask parts 2*b* formed on the semiconductor substrate 1 in region DK2, multiple mask parts 2*c* formed on the semiconductor substrate 1 in region DK3, multiple mask parts 2*d* formed on the semiconductor substrate 1 in region DK4, and multiple mask parts 2*e* formed on the semiconductor substrate 1 in the active region AR.

That is, among the mask layer 2, the part formed on the semiconductor substrate 1 in region DK1 corresponds to the mask part 2*a*, the part formed on the semiconductor substrate 1 in region DK2 corresponds to the mask part 2*b*, the part formed on the semiconductor substrate 1 in region DK3 corresponds to the mask part 2*c*, and the part formed on the semiconductor substrate 1 in region DK4 corresponds to the mask part 2*d*. Also, among the mask layer 2, the part formed on the semiconductor substrate 1 in the active region AR corresponds to the mask part 2*e*. The mask part 2*e* is formed over an entire active region AR. The mask parts 2*a*, 2*b*, 2*c*, 2*d*, and 2*e* are spaced apart from each other.

Multiple mask sections 2*a* formed on the semiconductor substrate 1 in the DK1 region are spaced apart from each other and extend (run parallel) along the DK1 region. Multiple mask sections 2*b* formed on the semiconductor substrate 1 in the DK2 region are spaced apart from each other and extend (run parallel) along the DK2 region. Multiple mask sections 2*c* formed on the semiconductor substrate 1 in the DK3 region are spaced apart from each other and extend (run parallel) along the DK3 region. Multiple mask sections 2*d* formed on the semiconductor substrate 1 in the DK4 region are spaced apart from each other and extend (run parallel) along the DK4 region. Therefore, in a plan view, a mask section 2*e* is formed over the entire active region AR, and each of the mask sections 2*a*, 2*b*, 2*c*, 2*d* extends so as to surround the mask section 2*e* (active region AR). That is, in a plan view, around the mask section 2*e* (active region AR), multiple mask sections 2*a* run parallel while circling, around which multiple mask sections 2*b* run parallel while circling, around which multiple mask sections 2*c* run parallel while circling, and around which multiple mask sections 2*d* run parallel while circling.

In a plan view, multiple mask sections 2*a* are arranged between the active region AR and multiple mask sections 2*b*, multiple mask sections 2*b* are arranged between multiple mask sections 2*a* and multiple mask sections 2*c*, and multiple mask sections 2*c* are arranged between multiple mask sections 2*b* and multiple mask sections 2*d*.

Each width W1 of the multiple mask sections 2*a* is the same, each width W2 of the multiple mask sections 2*b* is the same, each width W3 of the multiple mask sections 2*c* is the same, and each width W4 of the multiple mask sections 2*d* is the same. The width W1 of the mask section 2*a* is larger than the width W2 of the mask section 2*b*, the width W2 of the mask section 2*b* is larger than the width W3 of the mask section 2*c*, and the width W3 of the mask section 2*c* is larger than the width W4 of the mask section 2*d* (i.e., W1>W2>W3>W4).

The width W1 is a width (dimension) in a direction perpendicular to the extending direction of the mask section 2*a* and parallel to the main surface 1*a* of the semiconductor substrate 1. The width W2 is a width (dimension) in a direction perpendicular to the extending direction of the mask section 2*b* and parallel to the main surface 1*a* of the semiconductor substrate 1. The width W3 is a width (dimension) in a direction perpendicular to the extending direction of the mask section 2*c* and parallel to the main surface 1*a* of the semiconductor substrate 1. The width W4 is a width (dimension) in a direction perpendicular to the extending direction of the mask section 2*d* and parallel to the main surface 1*a* of the semiconductor substrate 1. In another view, the widths W1, W2, W3, W4 of the mask sections 2*a*, 2*b*, 2*c*, 2*d* are widths (dimensions) in a direction from the active region AR to the peripheral region PR in a plan view (i.e., in a direction away from the active region AR).

Also, it is preferable that the spacing S1 between adjacent mask sections 2*a*, the spacing S2 between adjacent mask sections 2*b*, the spacing S3 between adjacent mask sections 2*c*, and the spacing S4 between adjacent mask sections 2*d* are the same (i.e., S1=S2=S3=S4). That is, multiple mask sections 2*a* run parallel at a constant interval (S1), multiple mask sections 2*b* run parallel at a constant interval (S2), multiple mask sections 2*c* run parallel at a constant interval (S3), and multiple mask sections 2*d* run parallel at a constant interval (S4), and it is preferable that the spacing S1 between mask sections 2*a*, the spacing S2 between mask sections 2*b*, the spacing S3 between mask sections 2*c*, and the spacing S4 between mask sections 2*d* are the same. Also, it is preferable that the spacing between adjacent mask sections 2*e* and 2*a*, the spacing between adjacent mask sections 2*a* and 2*b*, the spacing between adjacent mask sections 2*b* and 2*c*, and the spacing between adjacent mask sections 2*c* and 2*d* are the same as each of the spacings S1, S2, S3, S4. Therefore, it is preferable that multiple mask sections 2*a*, 2*b*, 2*c*, 2*d* extend (run parallel) at equal intervals so as to surround the active region AR.

Figure 10:
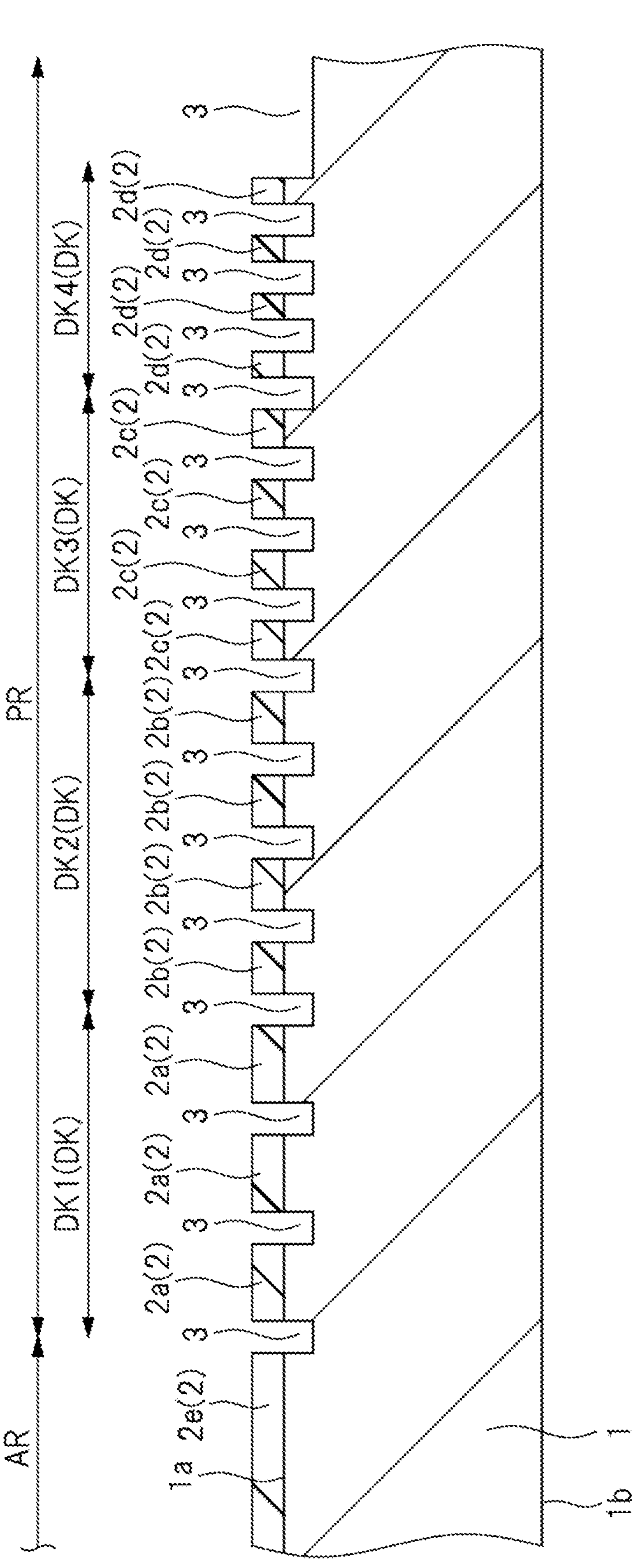
FIG. 10 is a cross-sectional view of the main portion of a semiconductor device during the manufacturing process following FIG. 8.

Next, as shown in FIG. 10, by using the mask layer 2 (i.e., mask sections 2*a*, 2*b*, 2*c*, 2*d*, 2*e*) as an etching mask and etching the semiconductor substrate 1, a groove 3 is formed in the semiconductor substrate 1. Anisotropic dry etching is preferred for this etching process.

In the semiconductor substrate 1, the parts covered by the mask layer 2 are not etched, and the parts exposed without being covered by the mask layer 2 are selectively etched, so the groove 3 is formed in alignment with the side surfaces of the mask sections 2*a*, 2*b*, 2*c*, 2*d*, 2*e*. That is, in a plan view, the groove 3 is formed between adjacent mask sections 2*e* and 2*a*, between adjacent mask sections 2*a*, between adjacent mask sections 2*a* and 2*b*, and between adjacent mask sections 2*b*. Also, in a plan view, the groove 3 is formed between adjacent mask sections 2*b* and 2*c*, between adjacent mask sections 2*c*, between adjacent mask sections 2*c* and 2*d*, between adjacent mask sections 2*d*, and outside the outermost mask section 2*d*.

Figure 11:
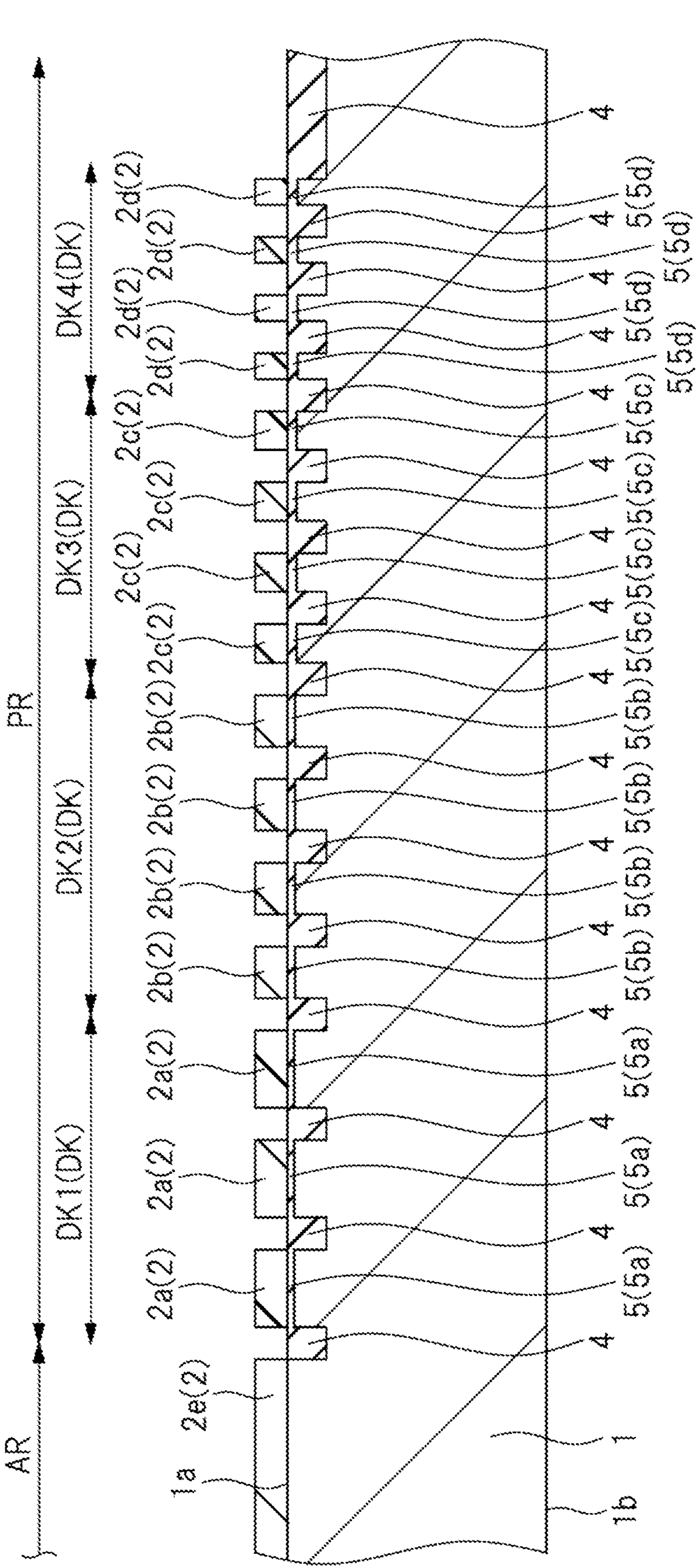
FIG. 11 is a cross-sectional view of the main portion of a semiconductor device during the manufacturing process following FIG. 10.

Next, as shown in FIG. 11, by performing a thermal oxidation process, the exposed semiconductor substrate 1 (surface) from the mask layer 2 (i.e., mask sections 2*a*, 2*b*, 2*c*, 2*d*, 2*e*) is thermally oxidized to form the field oxide film 4 made of silicon oxide. That is, the field oxide film 4 is formed using the LOCOS method. During this thermal oxidation process, the mask layer 2 (i.e., mask sections 2*a*, 2*b*, 2*c*, 2*d*, 2*e*) functions as a heat-resistant oxidation layer and suppresses the thermal oxidation of the semiconductor substrate 1 under the mask layer 2. Therefore, in the area of the main surface 1*a* of the semiconductor substrate 1 covered by the mask layer 2, the field oxide film 4 is not formed, and in the area not covered by the mask layer 2, the field oxide film 4 is formed. Therefore, in a plan view, the field oxide film 4 is formed between adjacent mask sections 2*e* and 2*a*, between adjacent mask sections 2*a*, between adjacent mask sections 2*a* and 2*b*, and between adjacent mask sections 2*b*. Also, in a plan view, the field oxide film 4 is formed between adjacent mask sections 2*b* and 2*c*, between adjacent mask sections 2*c*, between adjacent mask sections 2*c* and 2*d*, between adjacent mask sections 2*d*, and outside the outermost mask section 2*d*. The active region AR is covered by the mask section 2*e*, so the field oxide film 4 is formed in the peripheral region PR. The thickness of the field oxide film 4 can be, for example, about 1 to 2 micrometers.

In case of forming the field oxide film 4 by thermal oxidation after forming the groove 3 in the semiconductor substrate 1, the field oxide film 4 is formed by oxidizing the semiconductor substrate 1 exposed at the bottom and side surfaces of the groove 3. In this case, the field oxide film 4 is formed to fill the groove 3, but the depth position of a bottom surface of the field oxide film 4 becomes deeper than the depth position of a bottom surface of the groove 3.

As another embodiment, the process of forming the groove 3 in the semiconductor substrate 1 (the process of FIG. 10) can be omitted. If the groove 3 is not formed, the field oxide film 4 is formed by thermally oxidizing the upper surface of the semiconductor substrate 1 exposed without being covered by the mask layer 2. The formation position of the field oxide film 4 in a plan view is almost the same whether the groove 3 is formed or not.

In the thermal oxidation process for forming the field oxide film 4, a thin oxide film 5 can be formed under each mask part 2*a*, 2*b*, 2*c*, 2*d* (i.e., between the mask parts 2*a*, 2*b*, 2*c*, 2*d* and the semiconductor substrate 1). This is because oxygen can diffuse between the mask parts 2*a*, 2*b*, 2*c*, 2*d* and the semiconductor substrate 1 in the thermal oxidation process, and the surface of the semiconductor substrate 1 under the mask parts 2*a*, 2*b*, 2*c*, 2*d* can be slightly oxidized. In the thermal oxidation process for forming the field oxide film 4, the oxide film 5 formed under the mask part 2*a* is referred to as the oxide film 5*a*, the oxide film 5 formed under the mask part 2*b* is referred to as the oxide film 5*b*, the oxide film 5 formed under the mask part 2*c* is referred to as the oxide film 5*c*, and the oxide film 5 formed under the mask part 2*d* is referred to as the oxide film 5*d*.

The oxide film 5*a* is integrally formed on the surface of the semiconductor substrate 1 in region DK1 with the field oxide film 4 formed in region DK1. The oxide film 5*b* is integrally formed on the surface of the semiconductor substrate 1 in region DK2 with the field oxide film 4 formed in region DK2. The oxide film 5*c* is integrally formed on the surface of the semiconductor substrate 1 in region DK3 with the field oxide film 4 formed in region DK3. The oxide film 5*d* is integrally formed on the surface of the semiconductor substrate 1 in region DK4 with the field oxide film 4 formed in region DK4. The oxide film 5 (5*a*, 5*b*, 5*c*, 5*d*) is thinner than the field oxide film 4.

Figure 12:
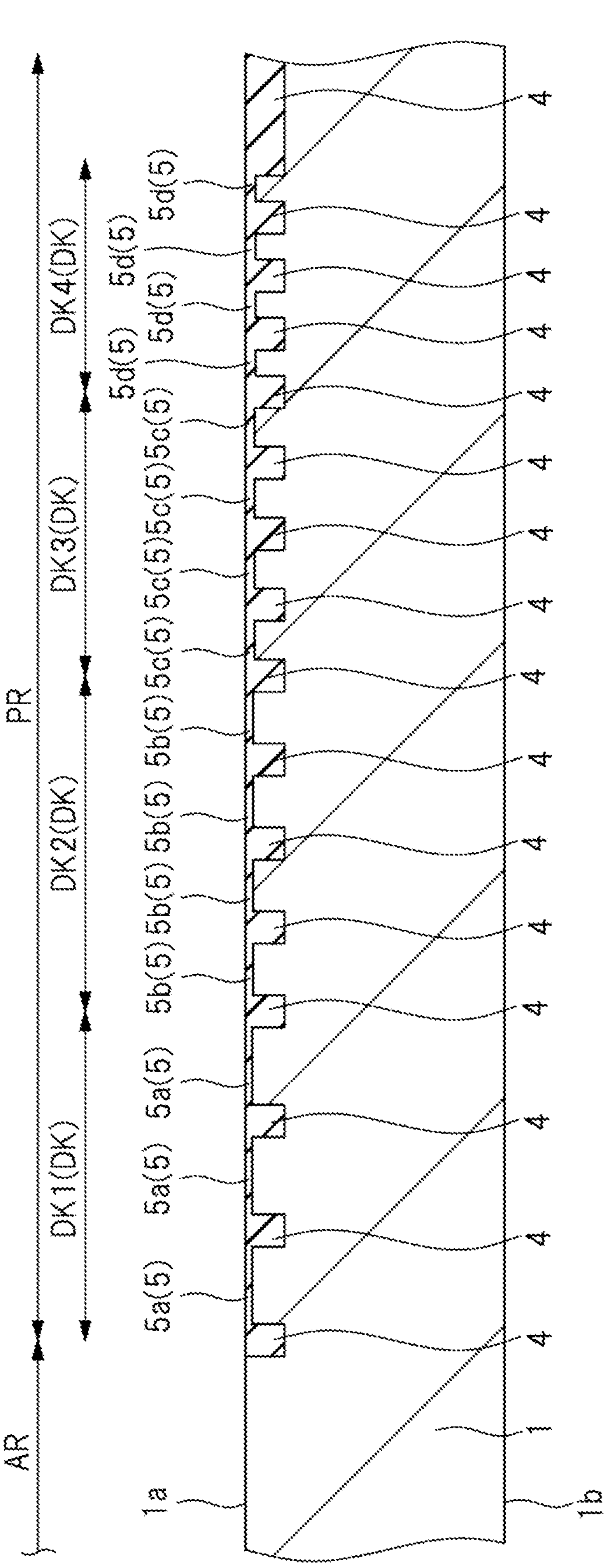
FIG. 12 is a cross-sectional view of the main portion of a semiconductor device during the manufacturing process following FIG. 11.

Next, as shown in FIG. 12, the mask layer 2 (mask parts 2*a*, 2*b*, 2*c*, 2*d*, 2*e*) is removed by etching. At this time, it is preferable to etch the mask layer 2 under conditions where the field oxide film 4, the oxide film 5, and the semiconductor substrate 1 are less likely to be etched compared to the mask layer 2. This allows the mask layer 2 to be etched and removed while suppressing or preventing the field oxide film 4, the oxide film 5, and the semiconductor substrate 1 from being etched. After removing the mask layer 2, if necessary, the upper part of the field oxide film 4 can also be polished using the CMP (Chemical Mechanical Polishing) method.

FIGS. 13 to 16 are partial enlarged cross-sectional views showing a part of FIG. 12, with a part of region DK1 enlarged in FIG. 13, a part of region DK2 enlarged in FIG. 14, a part of region DK3 enlarged in FIG. 15, and a part of region DK4 enlarged in FIG. 16.

As shown in FIG. 13, in region DK1, the oxide film 5*a* is integrally formed on the surface of the semiconductor substrate 1 between the field oxide film 4. Similarly, as shown in FIGS. 14, 15, and 16, in regions DK2, DK3, and DK4, the oxide films 5*b*, 5*c*, and 5*d* are integrally formed on the surface of the semiconductor substrate 1 between the field oxide film 4, respectively. The thickness T2 of the oxide film 5*b* is thicker than the thickness T1 of the oxide film 5*a*, the thickness T3 of the oxide film 5*c* is thicker than the thickness T2 of the oxide film 5*b*, and the thickness T4 of the oxide film 5*d* is thicker than the thickness T3 of the oxide film 5*c* (i.e., T1<T2<T3<T4). The reason is as follows.

As mentioned above, the width W1 of the mask part 2*a* is larger than the width W2 of the mask part 2*b*, the width W2 of the mask part 2*b* is larger than the width W3 of the mask part 2*c*, and the width W3 of the mask part 2*c* is larger than the width W4 of the mask part 2*d* (i.e., W1>W2>W3>W4).

The field oxide film 4 is formed on the semiconductor substrate 1 exposed from the mask layer 2. Therefore, the interval L12 between adjacent the field oxide film 4 in the region DK2 (refer to FIG. 14) becomes smaller than the interval L11 between adjacent the field oxide film 4 in the region DK1 (refer to FIG. 13). Also, the interval L13 between adjacent the field oxide film 4 in the region DK3 (refer to FIG. 15) becomes smaller than the interval L12 between adjacent the field oxide film 4 in the region DK2 (refer to FIG. 14). Furthermore, the interval L14 between adjacent the field oxide film 4 in the region DK4 (refer to FIG. 16) becomes smaller than the interval L13 between adjacent the field oxide film 4 in the region DK3 (refer to FIG. 15). In other words, L11>L12>L13>14 holds true.

In the thermal oxidation process for forming the field oxide film 4, the surface of the semiconductor substrate 1 under the mask parts 2*a*, 2*b*, 2*c*, 2*d* can be oxidized to form the thin oxide film 5, but the larger the width of the mask part, the thinner the thickness of the oxide film 5 formed under that mask part tends to be. This is because, in the thermal oxidation process for forming the field oxide film 4, oxygen diffuses between the mask part and the semiconductor substrate 1 to form the oxide film 5, but the larger the width of the mask part, the greater the diffusion distance of the oxygen required to form the oxide film 5 under that mask part, making it difficult to secure the amount of oxygen required to form the oxide film 5.

Therefore, the thickness T2 of the oxide film 5*b* formed under the mask part 2*b* with a width W2 smaller than the width W1 is larger than the thickness T1 of the oxide film 5*a* formed under the mask part 2*a* with a width W1. Also, the thickness T3 of the oxide film 5*c* formed under the mask part 2*c* with a width W3 smaller than the width W2 is larger than the thickness T2 of the oxide film 5*b* formed under the mask part 2*b* with a width W2. Furthermore, the thickness T4 of the oxide film 5*d* formed under the mask part 2*d* with a width W4 smaller than the width W3 is larger than the thickness T3 of the oxide film 5*c* formed under the mask part 2*c* with a width W3.

Also, the width of the mask part 2*e* formed in the active region AR is sufficiently larger than the width W1 of the mask part 2*a*. Therefore, except for the area near the side surface of the mask part 2*e*, the oxide film 5 is not formed under the mask part 2*e*.

The thickness T1 of the oxide film 5*a* formed on the surface of the semiconductor substrate 1 between the field oxide film 4 corresponds to the thickness of the oxide film 5*a* in the center between the field oxide film 4. The thickness T2 of the oxide film 5*b* formed on the surface of the semiconductor substrate 1 between the field oxide film 4 corresponds to the thickness of the oxide film 5*b* in the center between the field oxide film 4. The thickness T3 of the oxide film 5*c* formed on the surface of the semiconductor substrate 1 between the field oxide film 4 corresponds to the thickness of the oxide film 5*c* in the center between the field oxide film 4. The thickness T4 of the oxide film 5*d* formed on the surface of the semiconductor substrate 1 between the field oxide film 4 corresponds to the thickness of the oxide film 5*d* in the center between the field oxide film 4.

Each of the oxide films 5*a*, 5*b*, 5*c*, 5*d* is formed by utilizing the so-called bird's beak phenomenon during thermal oxidation to form the field oxide film 4, so the center between the field oxide film 4 is formed thinnest, and although not shown in the figure, near the edge of the field oxide film 4, it is slightly thicker than the center between the field oxide film 4.

As an example of the thickness of the oxide films 5*a*, 5*b*, 5*c*, 5*d*, it is as follows. The width W1 of the mask part 2*a* can be set to about 10 to 15 micrometers, the width W2 of the mask part 2*b* can be set to about 3 micrometers, the width W3 of the mask part 2*c* can be set to about 2.5 micrometers, and the width W4 of the mask part 2*d* can be set to about 2.3 micrometers. In this case, depending on the conditions of thermal oxidation, for example, the thickness T1 of the oxide film 5*a* can be about 20 nm or less, the thickness T2 of the oxide film 5*b* can be about 130 nm, the thickness T3 of the oxide film 5*c* can be about 240 nm, and the thickness T4 of the oxide film 5*d* can be about 280 nm. The intervals S1, S2, S3, S4 can be set to about 1 micrometer each, for example. In addition, it is not limited to this, and considering the conditions of thermal oxidation and ion-implantation, the widths W1, W2, W3, W4 and intervals S1, S2, S3, S4 of the mask parts 2*a*, 2*b*, 2*c*, 2*d* can be set to form the oxide films 5*a*, 5*b*, 5*c*, 5*d* with the desired thickness.

Also, it is permissible that the oxide film 5*a* is hardly formed under the mask part 2*a* of the region DK1 (that is, when T1=0 nm). This is because even if the oxide film 5*a* is not formed under the mask part 2*a* of the region DK1, a p-type semiconductor region 7*a* to be formed in the region DK1 can have a deeper depth and a higher impurity concentration than a p-type semiconductor region 7*b* to be formed in the region DK2.

Figure 17:
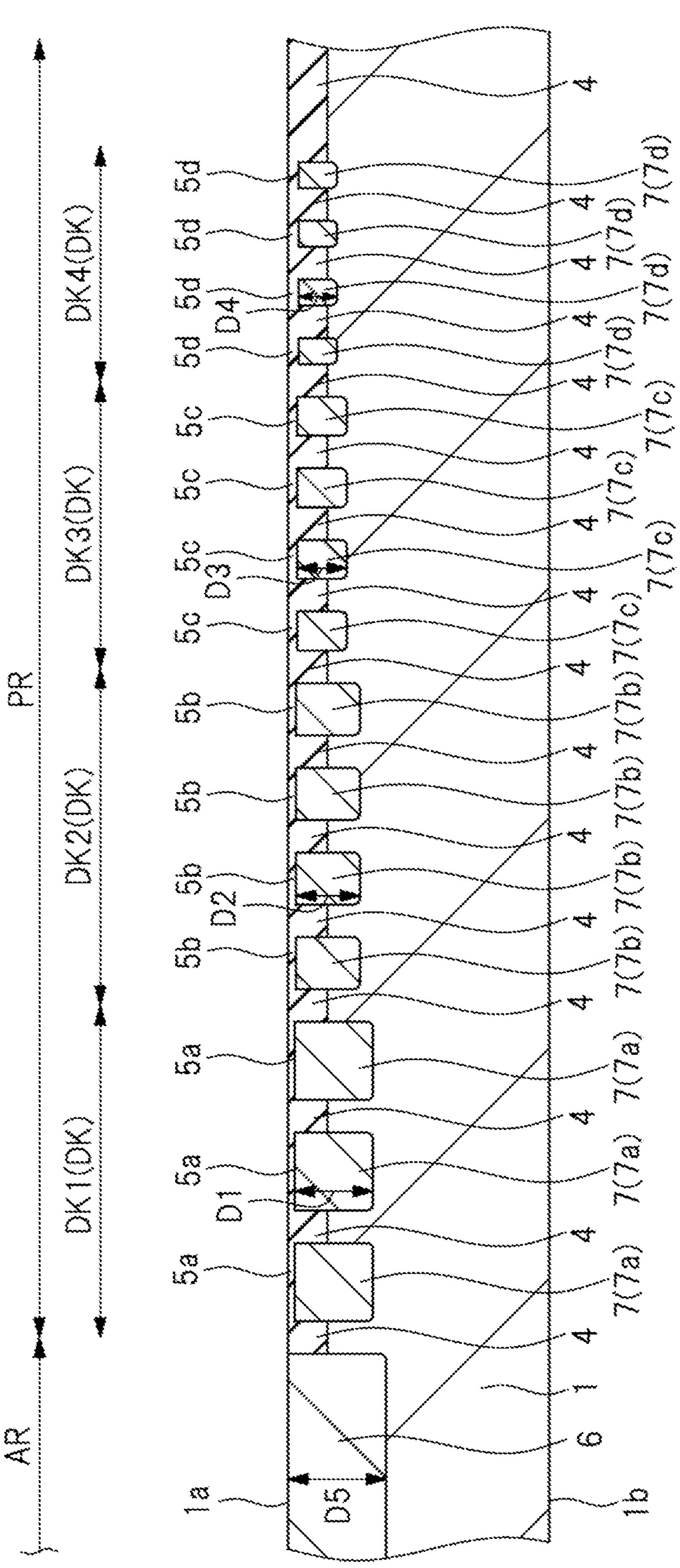
FIG. 17 is a cross-sectional view of the main portion of a semiconductor device during the manufacturing process following FIG. 12.

Next, as shown in FIG. 17, by using the field oxide film 4 as a mask for impurity introduction (ion-implantation blocking mask), p-type impurities are implanted into the main surface 1*a* of the semiconductor substrate 1 by ion-implantation, forming the p-type semiconductor region 6 and plurality of p-type semiconductor regions 7 (7*a*, 7*b*, 7*c*, 7*d*) in the semiconductor substrate 1. This process is referred to as the "p-type impurity ion-implantation process". The p-type semiconductor region 6 is formed in the semiconductor substrate 1 of the active region AR, and the plurality of p-type semiconductor regions 7 (7*a*, 7*b*, 7*c*, 7*d*) are formed in the semiconductor substrate 1 of the peripheral region PR.

The p-type semiconductor region 6 is formed over a predetermined depth from the main surface 1*a* of the semiconductor substrate 1 on the side of the main surface 1*a* of the semiconductor substrate 1 in the active region AR. Since the field oxide film 4 is not formed in the active region AR, in plan view, the p-type semiconductor region 6 is formed over almost the entire active region AR.

In the ion-implantation process of p-type impurities, the field oxide film 4 functions as a mask (ion-implantation prevention mask), suppressing or preventing the injection of p-type impurities into the semiconductor substrate 1 under the field oxide film 4. On the other hand, the thickness of the oxide film 5 (5*a*, 5*b*, 5*c*, 5*d*) is smaller than the thickness of the field oxide film 4. Therefore, in the ion-implantation process of p-type impurities, the p-type impurities pass through the oxide film 5 and are injected into the semiconductor substrate 1 under the oxide film 5. As a result, the p-type semiconductor region 7 is formed in the semiconductor substrate 1 under the oxide film 5.

Here, the p-type semiconductor region 7 formed under the oxide film 5*a* is referred to as the p-type semiconductor region 7*a*. Also, the p-type semiconductor region 7 formed under the oxide film 5*b* is referred to as the p-type semiconductor region 7*b*. Also, the p-type semiconductor region 7 formed under the oxide film 5*c* is referred to as the p-type semiconductor region 7*c*. Also, the p-type semiconductor region 7 formed under the oxide film 5*d* is referred to as the p-type semiconductor region 7*d*.

The p-type semiconductor region 7*a* is formed by p-type impurities injected into the semiconductor substrate 1 through the oxide film 5*a*, and is formed in the semiconductor substrate 1 of the region DK1. The depth position of a bottom surface of the p-type semiconductor region 7*a* is deeper than the depth position of a bottom surface of the field oxide film 4, but the p-type semiconductor region 7*a* is hardly formed under the field oxide film 4. Also, the p-type semiconductor region 7*b* is formed by p-type impurities injected into the semiconductor substrate 1 through the oxide film 5*b*, and is formed in the semiconductor substrate 1 of the region DK2. The depth position of the bottom surface of the p-type semiconductor region 7*b* is deeper than the depth position of the bottom surface of the field oxide film 4, but the p-type semiconductor region 7*b* is hardly formed under the field oxide film 4. Also, the p-type semiconductor region 7*c* is formed by p-type impurities injected into the semiconductor substrate 1 through the oxide film 5*c*, and is formed in the semiconductor substrate 1 of the region DK3. The depth position of a bottom surface of the p-type semiconductor region 7*c* is deeper than the depth position of the bottom surface of the field oxide film 4, but the p-type semiconductor region 7*c* is hardly formed under the field oxide film 4. Also, the p-type semiconductor region 7*d* is formed by p-type impurities injected into the semiconductor substrate 1 through the oxide film 5*d*, and is formed in the semiconductor substrate 1 of the region DK4. The depth position of a bottom surface of the p-type semiconductor region 7*d* is deeper than the depth position of the bottom surface of the field oxide film 4, but the p-type semiconductor region 7*d* is hardly formed under the field oxide film 4.

The depth D2 of the p-type semiconductor region 7*b* is shallower than the depth D1 of the p-type semiconductor region 7*a* (D1>D2), the depth D3 of the p-type semiconductor region 7*c* is shallower than the depth D2 of the p-type semiconductor region 7*b* (D2>D3), and the depth D4 of the p-type semiconductor region 7*d* is shallower than the depth D3 of the p-type semiconductor region 7*c* (D3>D4). Also, the depth D1 of the p-type semiconductor region 7*a* is shallower than the depth D5 of the p-type semiconductor region 6 (D5>D1). In other words, the depth position of the bottom surface of the p-type semiconductor region 7*a* is shallower than the depth position of the bottom surface of the p-type semiconductor region 6, the depth position of the bottom surface of the p-type semiconductor region 7*b* is shallower than the depth position of the bottom surface of the p-type semiconductor region 7*a*, the depth position of the bottom surface of the p-type semiconductor region 7*c* is shallower than the depth position of the bottom surface of the p-type semiconductor region 7*b*, and the depth position of the bottom surface of the p-type semiconductor region 7*d* is shallower than the depth position of the bottom surface of the p-type semiconductor region 7*c*.

Also, the impurity concentration (p-type impurity concentration) of the p-type semiconductor region 7*b* is lower than the impurity concentration (p-type impurity concentration) of the p-type semiconductor region 7*a*, the impurity concentration (p-type impurity concentration) of the p-type semiconductor region 7*c* is lower than the impurity concentration (p-type impurity concentration) of the p-type semiconductor region 7*b*, and the impurity concentration (p-type impurity concentration) of the p-type semiconductor region 7*d* is lower than the impurity concentration (p-type impurity concentration) of the p-type semiconductor region 7*c*. Also, the impurity concentration (p-type impurity concentration) of the p-type semiconductor region 7*a* is lower than the impurity concentration (p-type impurity concentration) of the p-type semiconductor region 6.

In other words, the depth of the p-type semiconductor regions 7*a*, 7*b*, 7*c*, 7*d* decreases in this order, and the concentration of p-type impurities also decreases. The reason is as follows.

That is, in the ion-implantation process of p-type impurities, p-type impurity ions that have passed through the oxide film 5 are introduced into the semiconductor substrate 1, forming the p-type semiconductor region 7. However, the oxide film 5 acts to inhibit (block) the progress of impurity ions. Therefore, the thicker the oxide film 5, the shorter the possible distance for the p-type impurity ions passing through the oxide film 5 to progress within the semiconductor substrate 1, and the amount of p-type impurity ions introduced into the semiconductor substrate 1 through the oxide film 5 decreases. As a result, the thicker the oxide film 5, the shallower the depth of the p-type semiconductor region 7 formed under the oxide film 5, and the lower the concentration of p-type impurities in the p-type semiconductor region 7 formed under the oxide film 5. As mentioned above, since the thickness of the oxide films 5*a*, 5*b*, 5*c*, 5*d* increases in this order, reflecting this, the depth of the p-type semiconductor regions 7*a*, 7*b*, 7*c*, 7*d* decreases in this order, and the concentration of p-type impurities also decreases.

Figure 18:
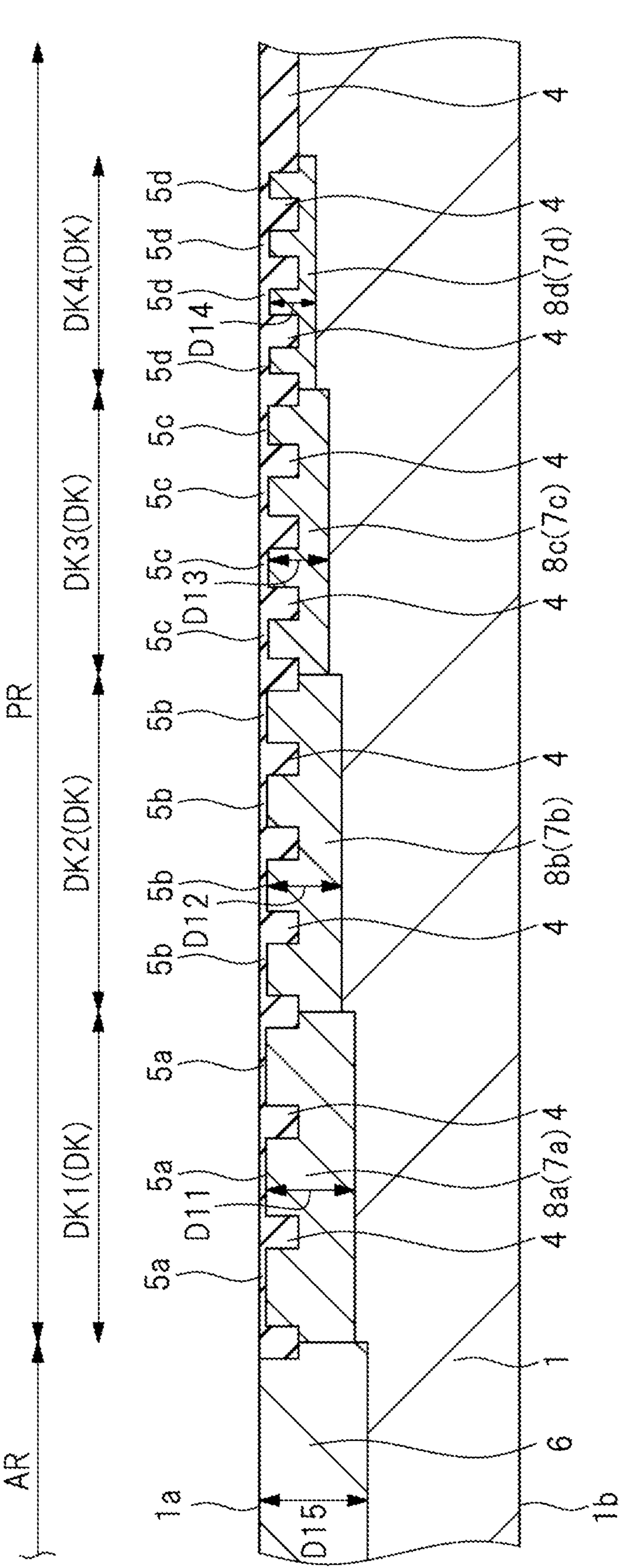
FIG. 18 is a cross-sectional view of the main portion of a semiconductor device during the manufacturing process following FIG. 17.

Next, a heat treatment (annealing) is performed to diffuse the p-type impurities introduced into the p-type semiconductor regions 6, 7 (7*a*, 7*b*, 7*c*, 7*d*). The state after this heat treatment is shown in FIG. 18. Hereinafter, this heat treatment is referred to as a heat diffusion process.

By the heat diffusion process, the p-type impurities in the p-type semiconductor region 6 can diffuse in the thickness direction and horizontal direction of the semiconductor substrate 1, so compared to before the heat diffusion process (FIG. 17), after the heat diffusion process (FIG. 18), the depth of the p-type semiconductor region 6 becomes deeper.

Also, by the heat diffusion process, the p-type impurities in the p-type semiconductor region 7 (7*a*, 7*b*, 7*c*, 7*d*) can diffuse in the thickness direction and horizontal direction of the semiconductor substrate 1. Therefore, compared to before the heat diffusion process (FIG. 17), after the heat diffusion process (FIG. 18), the depth of the p-type semiconductor region 7 (7*a*, 7*b*, 7*c*, 7*d*) becomes deeper, and the p-type semiconductor region 7 (7*a*, 7*b*, 7*c*, 7*d*) also spreads in the horizontal direction of the semiconductor substrate 1. As a result, the p-type semiconductor region 8*a* is formed in the semiconductor substrate 1 of the region DK1, the p-type semiconductor region 8*b* is formed in the semiconductor substrate 1 of the region DK2, the p-type semiconductor region 8*c* is formed in the semiconductor substrate 1 of the region DK3, and the p-type semiconductor region 8*d* is formed in the semiconductor substrate 1 of the region DK4. The heat diffusion process can be performed, for example, by heat treatment at a temperature of about 1100 to 1200 degree Celsius for about 1 to 10 hours, but the heat treatment conditions can be changed as necessary.

The p-type semiconductor region 8*a* is formed by the connection (overlap) of plurality of p-type semiconductor regions 7*a* that have diffused in the heat diffusion process. Similarly, the p-type semiconductor region 8*b* is formed by the connection (overlap) of plurality of p-type semiconductor regions 7*b* that have diffused in the heat diffusion process. The p-type semiconductor region 8*c* is formed by the connection (overlap) of plurality of p-type semiconductor regions 7*c* that have diffused in the heat diffusion process. The p-type semiconductor region 8*d* is formed by the connection (overlap) of plurality of p-type semiconductor regions 7*d* that have diffused in the heat diffusion process.

As mentioned above, the p-type semiconductor regions 7*a*, 7*b*, 7*c*, 7*d* become shallower and the p-type impurity concentration decreases in this order. Reflecting this, the p-type semiconductor regions 8*a*, 8*b*, 8*c*, 8*d* also become shallower and the p-type impurity concentration decreases in this order. Furthermore, the p-type semiconductor region 8*a* becomes shallower and the p-type impurity concentration decreases compared to the p-type semiconductor region 6.

In other words, the depth D11 of the p-type semiconductor region 8*a* is shallower than the depth D15 of the p-type semiconductor region 6, the depth D12 of the p-type semiconductor region 8*b* is shallower than the depth D11 of the p-type semiconductor region 8*a*, the depth D13 of the p-type semiconductor region 8*c* is shallower than the depth D12 of the p-type semiconductor region 8*b*, and the depth D14 of the p-type semiconductor region 8*d* is shallower than the depth D13 of the p-type semiconductor region 8*c* (D15>D11>D12>D13>D14). Also, the p-type impurity concentration of the p-type semiconductor region 8*a* is lower than that of the p-type semiconductor region 6, the p-type impurity concentration of the p-type semiconductor region 8*b* is lower than that of the p-type semiconductor region 8*a*, the p-type impurity concentration of the p-type semiconductor region 8*c* is lower than that of the p-type semiconductor region 8*b*, and the p-type impurity concentration of the p-type semiconductor region 8*d* is lower than that of the p-type semiconductor region 8*c*.

As a result, the depth of the p-type semiconductor region 8 for electric field relaxation formed by the p-type semiconductor regions 8*a*, 8*b*, 8*c*, 8*d* gradually becomes shallower as it moves away from the position adjacent to the p-type semiconductor region 6 (moves away in the horizontal direction). Also, the p-type impurity concentration of the p-type semiconductor region 8 for electric field relaxation formed by the p-type semiconductor regions 8*a*, 8*b*, 8*c*, 8*d* gradually decreases as it moves away from the position adjacent to the p-type semiconductor region 6 (moves away in the horizontal direction). This forms the p-type semiconductor region 8 with a VLD structure.

Reflecting the fact that the widths W1, W2, W3, W4 of the mask parts 2*a*, 2*b*, 2*c*, 2*d* decrease in this order, the intervals L11, L12, L13, L14 between adjacent the field oxide films 4 in the regions DK1, DK2, DK3, DK4 also decrease in this order. As a result, the widths of the p-type semiconductor regions 7*a*, 7*b*, 7*c*, 7*d* also decrease in this order. This can contribute to the p-type impurity concentration of the p-type semiconductor regions 8*a*, 8*b*, 8*c*, 8*d* decreasing in this order.

Figure 19:
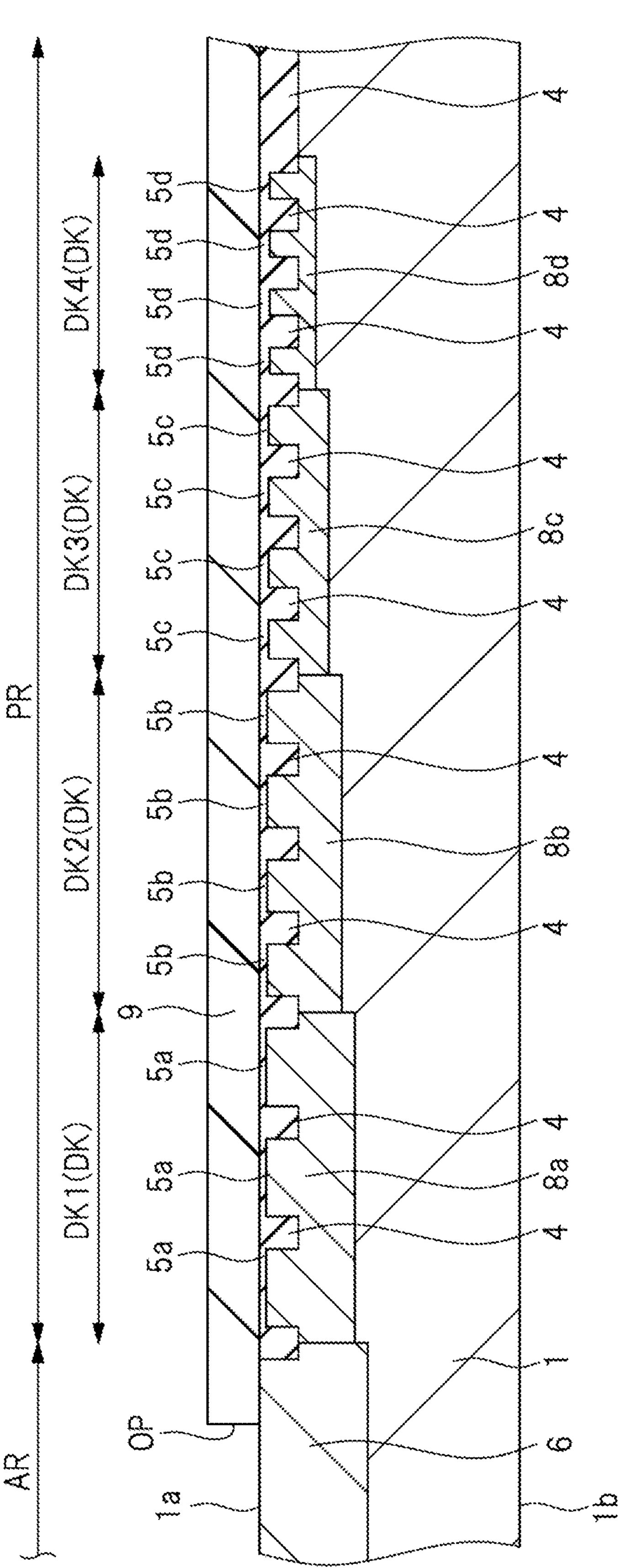
FIG. 19 is a cross-sectional view of the main portion of a semiconductor device during the manufacturing process following FIG. 18.

Next, as shown in FIG. 19, an insulating film 9 is formed to cover the field oxide film 4 and oxide film 5 (5*a*, 5*b*, 5*c*, 5*d*) on the main surface 1*a* of the semiconductor substrate 1. The insulating film 9 is composed of a single silicon oxide film (for example, a BPSG film) or a laminated film of silicon nitride film and silicon oxide film, and can be formed using methods such as CVD. The thickness of the insulating film 9 can be set to about 1 to 2 micrometers, for example.

Next, using photolithography and etching techniques, an opening OP is formed in the insulating film 9. The opening OP is formed so as to be contained in the p-type semiconductor region 6 in plan view, and the semiconductor substrate 1 (p-type semiconductor region 6) is exposed at the bottom of the opening OP.

Figure 20:
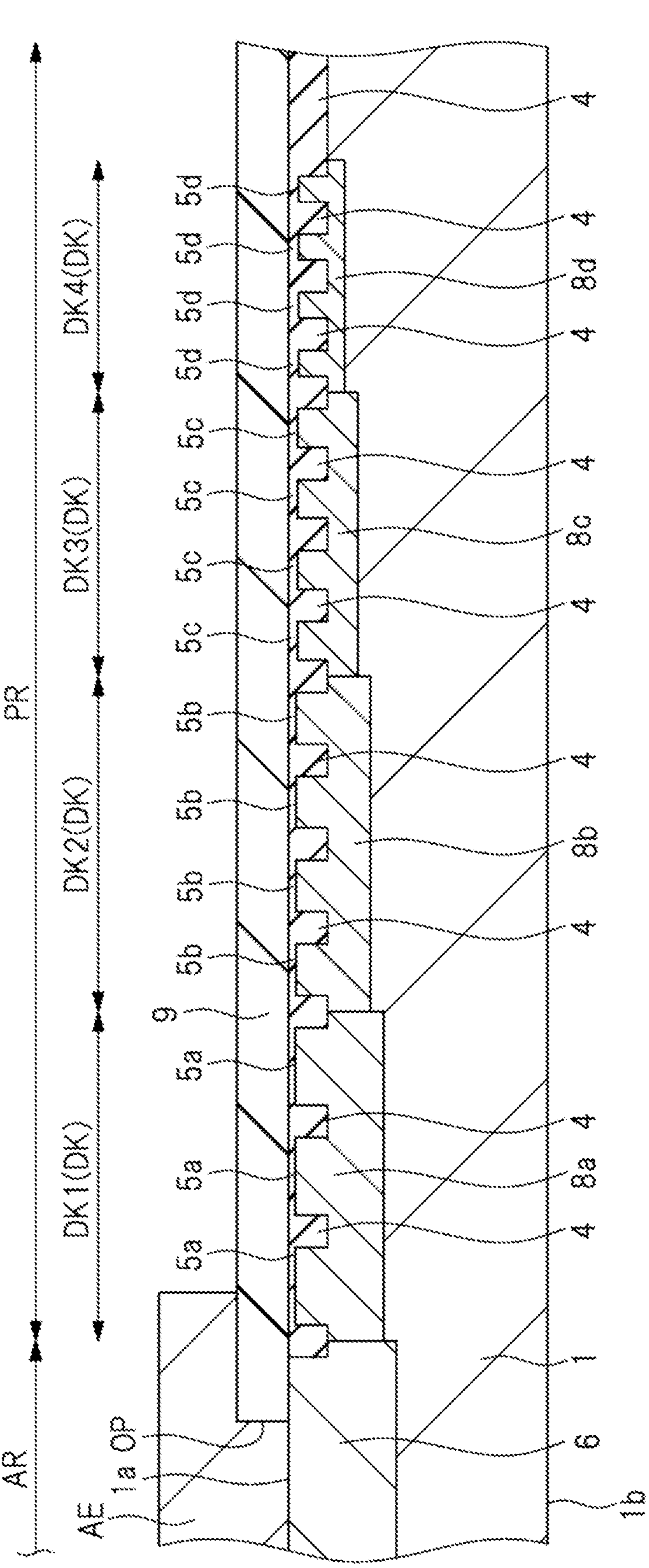
FIG. 20 is a cross-sectional view of the main portion of a semiconductor device during the manufacturing process following FIG. 19.

Next, as shown in FIG. 20, an anode electrode AE is formed. The anode electrode AE is formed on the p-type semiconductor region 6 exposed from the opening OP, and is in contact with the p-type semiconductor region 6 and electrically connected to the p-type semiconductor region 6. A part (peripheral part) of the anode electrode AE is located on the insulating film 9.

The method of forming the anode electrode AE can use any method. For example, the anode electrode AE can be formed by patterning a metal film formed using a method such as sputtering using photolithography and etching techniques. Alternatively, the anode electrode AE can be formed by forming a photoresist pattern with an opening in the planned anode electrode AE formation area, and then forming a plating film in the opening. The thickness of the anode electrode AE can be set to about 2 to 10 micrometers, for example.

Also, if necessary, a protective film (not shown) made of a material such as polyimide resin can be formed on the insulating film 9 to cover the anode electrode AE, and an opening can be formed in the protective film to expose a part of the anode electrode AE.

Next, if necessary, the bottom surface 1*b* of the semiconductor substrate 1 is ground to thin the semiconductor substrate 1.

Figure 21:
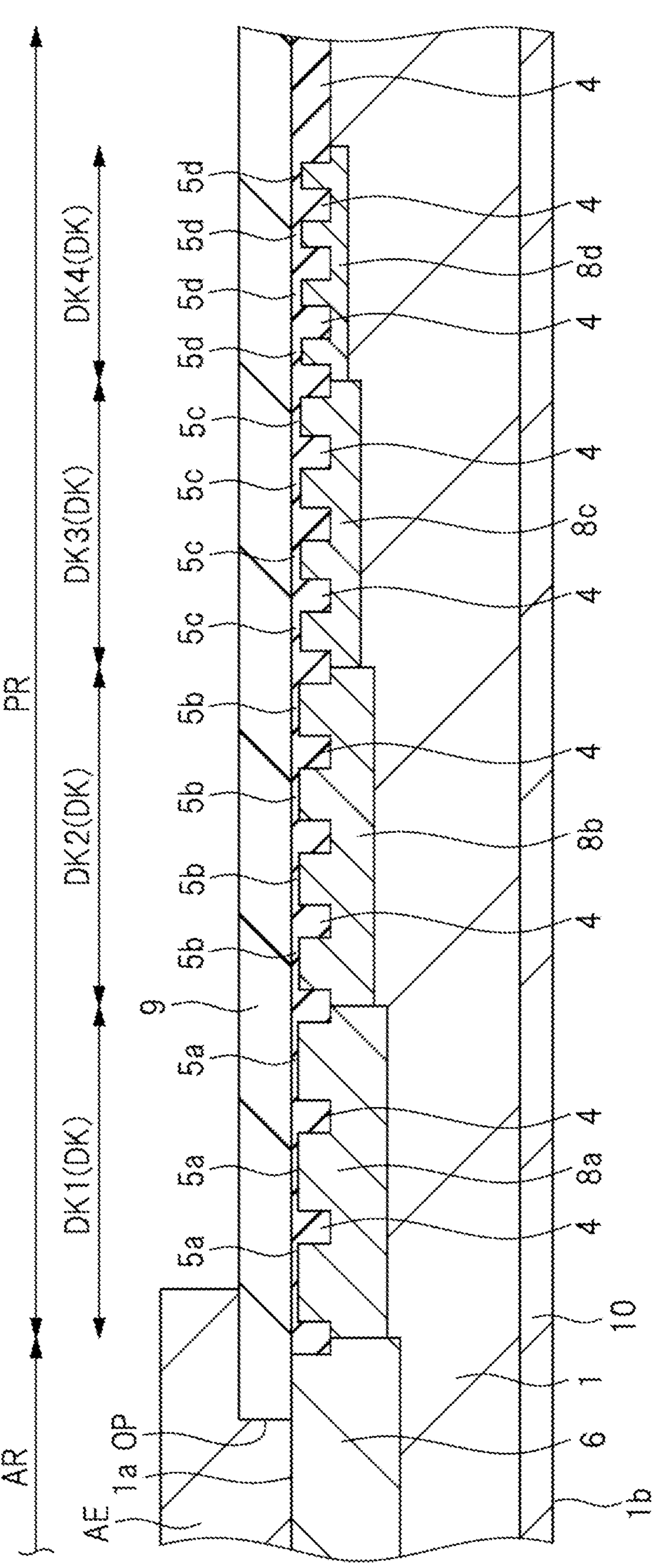
FIG. 21 is a cross-sectional view of the main portion of a semiconductor device during the manufacturing process following FIG. 20.

Next, as shown in FIG. 21, an n-type impurity is ion-implanted into the bottom surface 1*b* of the semiconductor substrate 1 to form the n-type semiconductor region 10 in the semiconductor substrate 1.

Figure 22:
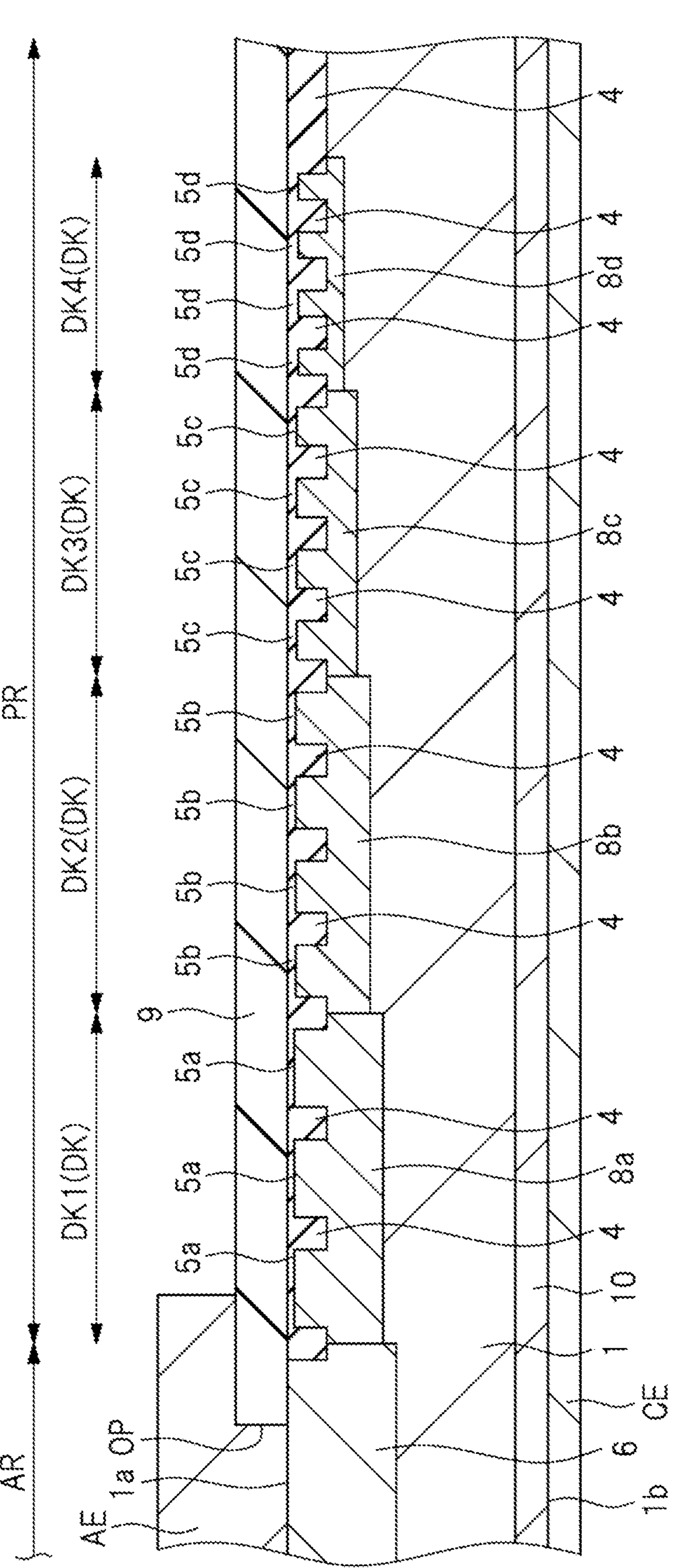
FIG. 22 is a cross-sectional view of the main portion of a semiconductor device during the manufacturing process following FIG. 21.

Next, as shown in FIG. 22, a cathode electrode CE, which is electrically connected to the n-type semiconductor region 10, is formed on the bottom surface 1*b* of the semiconductor substrate 1 using a method such as sputtering.

Subsequently, the semiconductor substrate 1 is cut into pieces by dicing. This results in the production of a semiconductor device CP as a semiconductor chip.

A Main Features and Effects

High withstand voltage semiconductor devices have a terminal structure provided to improve the breakdown voltage. As a terminal structure to improve the breakdown voltage, there are RESURF structures and VLD structures, but compared to RESURF structures, VLD structures can more effectively mitigate electric field concentration and can make the breakdown voltage of the semiconductor device higher.

In the present embodiment, the oxide films 5*a*, 5*b*, 5*c*, 5*d* with different thicknesses are formed, and by forming the p-type semiconductor regions 7*a*, 7*b*, 7*c*, 7*d* with impurity ions passing through these oxide films 5*a*, 5*b*, 5*c*, 5*d*, the p-type semiconductor regions 7*a*, 7*b*, 7*c*, 7*d* with different depths and impurity concentrations can be formed.

In the present embodiment, the oxide films 5*a*, 5*b*, 5*c*, 5*d* with different thicknesses are integrally formed with the field oxide film 4 using the LOCOS method when forming the field oxide film 4. One of the main features of the present embodiment is that by devising the oxidation-resistant mask layer 2 used to form the field oxide film 4, the oxide films 5*a*, 5*b*, 5*c*, 5*d* with different thicknesses are formed.

That is, for the mask parts 2*a*, 2*b*, 2*c*, 2*d* that make up the mask layer 2, by reducing the widths W1, W2, W3, W4 of the mask parts 2*a*, 2*b*, 2*c*, 2*d* in this order, the thickness of the oxide films 5*a*, 5*b*, 5*c*, 5*d* formed under the mask parts 2*a*, 2*b*, 2*c*, 2*d* is increased in this order. This allows for the easy and accurate formation of the oxide films 5*a*, 5*b*, 5*c*, 5*d* with different thicknesses, and also, using these oxide films 5*a*, 5*b*, 5*c*, 5*d*, the p-type semiconductor regions 7*a*, 7*b*, 7*c*, 7*d* with different depths and impurity concentrations can be easily and accurately formed. Therefore, it is possible to easily and accurately form the electric field relaxation layer (p-type semiconductor region 8) of the VLD structure.

Unlike the present embodiment, it is conceivable to form a silicon oxide film on the main surface 1*a* of the semiconductor substrate 1 and then etch the silicon oxide film multiple times to form multiple silicon oxide film regions with different thicknesses. However, in that case, it is necessary to repeat multiple cycles of the process of forming a photoresist pattern on the silicon oxide film, the process of etching the silicon oxide film exposed from the photoresist pattern, and the process of removing the photoresist pattern. However, in this case, the number of manufacturing processes increases, leading to an increase in manufacturing costs. Also, the increase in the number of necessary photomasks for exposure leads to an increase in manufacturing costs.

In contrast, in the present embodiment, at the stage of forming the field oxide film 4, the oxide films 5*a*, 5*b*, 5*c*, 5*d* with different thicknesses can be integrally formed with the field oxide film 4. Therefore, the number of manufacturing processes for the semiconductor device can be reduced, and the manufacturing cost of the semiconductor device can be reduced. Also, in the present embodiment, although a photomask for exposure is used when forming the oxidation-resistant mask layer 2 (i.e., patterning the silicon nitride film), after forming the mask layer 2, even without using a photomask for exposure (i.e., without forming a photoresist pattern), the oxide films 5*a*, 5*b*, 5*c*, 5*d* with different thicknesses can be formed. This also allows for the reduction of the manufacturing cost of the semiconductor device.

In the present embodiment, the p-type semiconductor regions 7*a*, 7*b*, 7*c*, 7*d* can be formed in a single ion-implantation process, which can reduce the number of manufacturing steps of the semiconductor device and also the manufacturing cost, compared to the case of forming the p-type semiconductor regions 7*a*, 7*b*, 7*c*, 7*d* in separate ion-implantation processes.

In the present embodiment, the VLD structure of the electric field relaxation layer (p-type semiconductor region 8) is formed by the p-type semiconductor regions 8*a* (7*a*) in region DK1, 8*b* (7*b*) in region DK2, 8*c* (7*c*) in region DK3, and 8*d* (7*d*) in region DK4. As another embodiment, one or two of regions DK1, DK2, DK3, DK4 can be omitted. For example, in case of omitting region DK3, region DK1 is adjacent to the periphery of the active region AR, region DK2 is adjacent to the periphery of region DK1, and region DK4 is adjacent to the periphery of region DK2, and the mask part 2*c*, the oxide film 5*c*, the p-type semiconductor region 7*c* and the p-type semiconductor region 8*c* are not formed.

Also, the mask layer 2 can have multiple mask parts with a width smaller than the width W4 of the multiple mask parts 2*d* on the outer periphery of the mask parts 2*d*. In this case, the oxide film 5 thicker than the oxide film 5*d* is formed under the mask parts with a width smaller than W4, and in the ion-implantation process of p-type impurities, the p-type semiconductor region 7 with a shallower depth and lower impurity concentration than the p-type semiconductor region 7*d* can be formed under the oxide film 5 thicker than the oxide film 5*d*.

The invention made by the present inventor has been described above in detail based on the embodiment, but the present invention is not limited to the embodiment described above, and it is needless to say that various modifications can be made without departing from the gist thereof.

What is claimed is:

1. A manufacturing method of a semiconductor device, comprising the steps of:

(a) preparing a semiconductor substrate having an active region and a peripheral region surrounding the active region in a plan view;

(b) selectively forming an oxidation-resistant mask layer on a main surface of the semiconductor substrate in the peripheral region;

(c) forming a field oxide film in the peripheral region by thermally oxidizing the semiconductor substrate exposed from the oxidation-resistant mask layer;

(d) after the step of (c), removing the oxidation-resistant mask layer; and (e) after the step of (d), forming a plurality of semiconductor regions of a first conductivity type in the peripheral region by introducing impurities of the first conductivity type into the main surface of the semiconductor substrate using the field oxide film as a mask, wherein in a direction from the active region to the peripheral region, the oxidation-resistant mask layer has a plurality of first portions with a first width and a plurality of second portions with a second width smaller than the first width, in the step of (c), a first oxide film is integrally formed with the field oxide film under the plurality of first portions, and a second oxide film thicker than the first oxide film is integrally formed with the field oxide film under the plurality of second portions, the plurality of semiconductor regions includes a first semiconductor region formed under the first oxide film and a second semiconductor region formed under the second oxide film, and a depth of the second semiconductor region is shallower than a depth of the first semiconductor region.

2. The manufacturing method of the semiconductor device according to claim 1, wherein an impurity concentration of the second semiconductor region is lower than an impurity concentration of the first semiconductor region.

3. The manufacturing method of the semiconductor device according to claim 2, wherein the plurality of first portions is arranged between the active region and the plurality of second portions, in a plan view.

4. The manufacturing method of the semiconductor device according to claim 1, wherein in the step of (e), the first semiconductor region is formed by introducing impurities of the first conductivity type that have passed through the first oxide film, and the second semiconductor region is formed by introducing impurities of the first conductivity type that have passed through the second oxide film.

5. The manufacturing method of the semiconductor device according to claim 1, further comprising the step of:

(f) after the step of (e), heat-treating the semiconductor substrate.

6. The manufacturing method of the semiconductor device according to claim 5, wherein the heat-treatment in the step of (f) is a heat-treatment for diffusing the impurities of the first conductivity type introduced into the plurality of semiconductor regions in the step of (e).

7. The manufacturing method of the semiconductor device according to claim 1, wherein in the step of (b), the oxidation-resistant mask layer is formed on an entire main surface of the semiconductor substrate in the active region.

8. The manufacturing method of the semiconductor device according to claim 1, wherein the oxidation-resistant mask layer is made of silicon nitride.

9. The manufacturing method of the semiconductor device according to claim 1, wherein in the step of (e), a third semiconductor region of the first conductivity type is formed in the active region.

10. The manufacturing method of the semiconductor device according to claim 9, wherein the third semiconductor region functions as an anode region of a diode.

11. The manufacturing method of the semiconductor device according to claim 9, wherein the semiconductor substrate prepared in the step of (a) is a semiconductor substrate of a second conductivity type opposite to the first conductivity type.

12. The manufacturing method of the semiconductor device according to claim 11, further comprising the step of:

(g) after the step of (e), forming a fourth semiconductor region of the second conductivity type in the semiconductor substrate by introducing impurities of the second conductivity type into a bottom surface of the semiconductor substrate opposite to the main surface.

13. The manufacturing method of the semiconductor device according to claim 12, wherein a diode is formed by the third semiconductor region, the fourth semiconductor region, and a region between the third semiconductor region and the fourth semiconductor region in the semiconductor substrate.

14. The manufacturing method of the semiconductor device according to claim 13, further comprising the step of:

(f) after the step of (e) before the step of (g), heat-treating the semiconductor substrate;

(h) after the step of (f) before the step of (g), forming a first electrode electrically connected to the third semiconductor region on the main surface of the semiconductor substrate; and (i) after the step of (g), forming a second electrode electrically connected to the fourth semiconductor region on the bottom surface of the semiconductor substrate.

15. The manufacturing method of the semiconductor device according to claim 1, wherein the oxidation-resistant mask layer has a plurality of third portions having a third width smaller than the second width in the direction from the active region to the peripheral region, in the step of (c), a third oxide film thicker than the second oxide film is integrally formed with the field oxide film under the plurality of third portions, the plurality of semiconductor regions includes a fifth semiconductor region formed under the third oxide film, and a depth of the fifth semiconductor region is shallower than the depth of the second semiconductor region.

16. The manufacturing method of the semiconductor device according to claim 15, wherein an impurity concentration of the second semiconductor region is lower than an impurity concentration of the first semiconductor region, and an impurity concentration of the fifth semiconductor region is lower than the impurity concentration of the second semiconductor region.

17. The manufacturing method of the semiconductor device according to claim 16, wherein the plurality of first portions is arranged between the active region and the plurality of second portions, in a plan view, and the plurality of first portions is arranged between the active region and the plurality of second portions, in a plan view.

18. The manufacturing method of the semiconductor device according to claim 17, wherein in the direction from the active region to the peripheral region, the oxidation-resistant mask layer has a plurality of fourth portions with a fourth width smaller than the third width, in the step of (c), a fourth oxide film thicker than the third oxide film is integrally formed with the field oxide film under the plurality of fourth portions, the plurality of semiconductor regions includes a sixth semiconductor region formed under the fourth oxide film, a depth of the sixth semiconductor region is shallower than the depth of the fifth semiconductor region, an impurity concentration of the sixth semiconductor region is lower than the impurity concentration of the fifth semiconductor region, and the plurality of third portions is arranged between the plurality of second portions and the plurality of fourth portions, in a plan view.

* * * * *